(12) United States Patent
Tang et al.

(10) Patent No.: US 12,185,577 B2
(45) Date of Patent: Dec. 31, 2024

(54) DISPLAY PANEL AND DISPLAY DEVICE

(71) Applicant: Shanghai Tianma Micro-Electronics Co., Ltd., Shanghai (CN)

(72) Inventors: Shihao Tang, Shanghai (CN); Yang Zeng, Shanghai (CN); Haochi Yu, Shanghai (CN); Yaodong Wu, Shanghai (CN); Feng Lu, Shanghai (CN); Qijun Yao, Shanghai (CN); Jiaxian Liu, Shanghai (CN); Ping An, Shanghai (CN)

(73) Assignee: Shanghai Tianma Micro-Electronics Co., Ltd., Shanghai (CN)

(*) Notice: Subject to any disclaimer, the term of this patent is extended or adjusted under 35 U.S.C. 154(b) by 491 days.

(21) Appl. No.: 17/521,834

(22) Filed: Nov. 8, 2021

(65) Prior Publication Data

US 2022/0069261 A1    Mar. 3, 2022

(30) Foreign Application Priority Data

Jun. 30, 2021   (CN) ......................... 202110736344.9

(51) Int. Cl.
  *H01L 51/52*   (2006.01)
  *H10K 50/86*   (2023.01)
  *H10K 59/122*  (2023.01)
(52) U.S. Cl.
  CPC ......... *H10K 50/865* (2023.02); *H10K 59/122* (2023.02)

(58) Field of Classification Search
  CPC .. H10K 50/865; H10K 59/122; H10K 59/126; H10K 59/38
  See application file for complete search history.

(56) References Cited

U.S. PATENT DOCUMENTS

| 2021/0036073 A1* | 2/2021 | Cho ..................... H10K 59/126 |
| 2021/0335909 A1* | 10/2021 | Wang ..................... H10K 71/00 |
| 2022/0045302 A1* | 2/2022 | Xu ........................ H10K 59/124 |

FOREIGN PATENT DOCUMENTS

| CN | 102271219 A | 12/2011 |
| CN | 109545825 A | 3/2019 |
| CN | 111312792 A | 6/2020 |
| KR | 20160129932 A | 11/2016 |

* cited by examiner

*Primary Examiner* — Jaehwan Oh
(74) *Attorney, Agent, or Firm* — KILPATRICK TOWNSEND & STOCKTON LLP

(57) ABSTRACT

Provided are a display panel and a display device, where the display panel includes a first light-emitting unit and a first color-resist block which are correspondingly disposed, where the first color-resist block includes a first display color-resist block and a first imaging color-resist block, the first light-emitting unit includes a first boundary and a second boundary which are disposed opposite to each other, the first boundary is located on a side of the second boundary near the first imaging color-resist block, the first display color-resist block includes a first edge and a second edge which are disposed opposite to each other, the first edge is located on a side of the second edge near the first imaging color-resist block, and a maximum distance between the first boundary and the first edge is greater than a maximum distance between the second boundary and the second edge.

20 Claims, 12 Drawing Sheets

DISPLAY PANEL AND DISPLAY DEVICE

CROSS-REFERENCE TO RELATED APPLICATION(S)

This application claims priority to Chinese patent application No. 202110736344.9 filed Jun. 30, 2021, the disclosure of which is incorporated herein by reference in its entirety.

FIELD

Embodiments of the present disclosure relate to the field of display technologies and, in particular, to a display panel and a display device.

BACKGROUND

With the continuous improvement of living standards, the requirements of users for the display effect of corresponding display devices become increasingly getting high. How to realize the real "full screen display" has become the direction of efforts of research and development personnel.

At present, there is a scheme which is, according to the principle of pinhole imaging, to open holes on at least two functional layers of the display region of the display panel to provide a working optical path for photosensitive functional elements (such as cameras and infrared sensors), which ensures the normal display function at the location of the photosensitive functional elements while satisfying the working requirements of the photosensitive functional elements, to increase the screen-to-body ratio of the display panel.

However, when the display panel performs display, there will be extra light of large viewing angle leaked through holes, which causes the poor brightness uniformity of the display panel under the large viewing angle.

SUMMARY

The present disclosure provides a display panel and a display device to improve the brightness uniformity of the display panel.

In one embodiment of the present disclosure provides a display panel. The display panel includes: a substrate; multiple light-emitting units located on a side of the substrate; and multiple color-resist blocks which are sequentially located on a side of the multiple light-emitting units facing away from the substrate.

Each light-emitting unit includes a first light-emitting unit, each color-resist block includes a first color-resist block, and the first color-resist block and the first light-emitting unit are correspondingly disposed.

The first color-resist block includes a first display color-resist block and a first imaging color-resist block. The vertical projection of the first display color-resist block on a plane where the substrate is located covers the vertical projection of the first light-emitting unit on the plane where the substrate is located.

The first light-emitting unit includes a first boundary and a second boundary which are disposed opposite to each other. Along a direction parallel to the plane where the substrate is located, the first boundary is located on a side of the second boundary near the first imaging color-resist block.

The first display color-resist block includes a first edge and a second edge which are disposed opposite to each other. Along the direction parallel to the plane where the substrate is located, the first edge is located on a side of the second edge near the first imaging color-resist block.

Along the direction parallel to the plane where the substrate is located, a maximum distance between the first boundary and the first edge is greater than a maximum distance between the second boundary and the second edge.

In another embodiment of the present disclosure further provides a display device. The display device includes a preset functional element and the display panel described in the embodiments.

DETAILED DESCRIPTION

Figure 1:
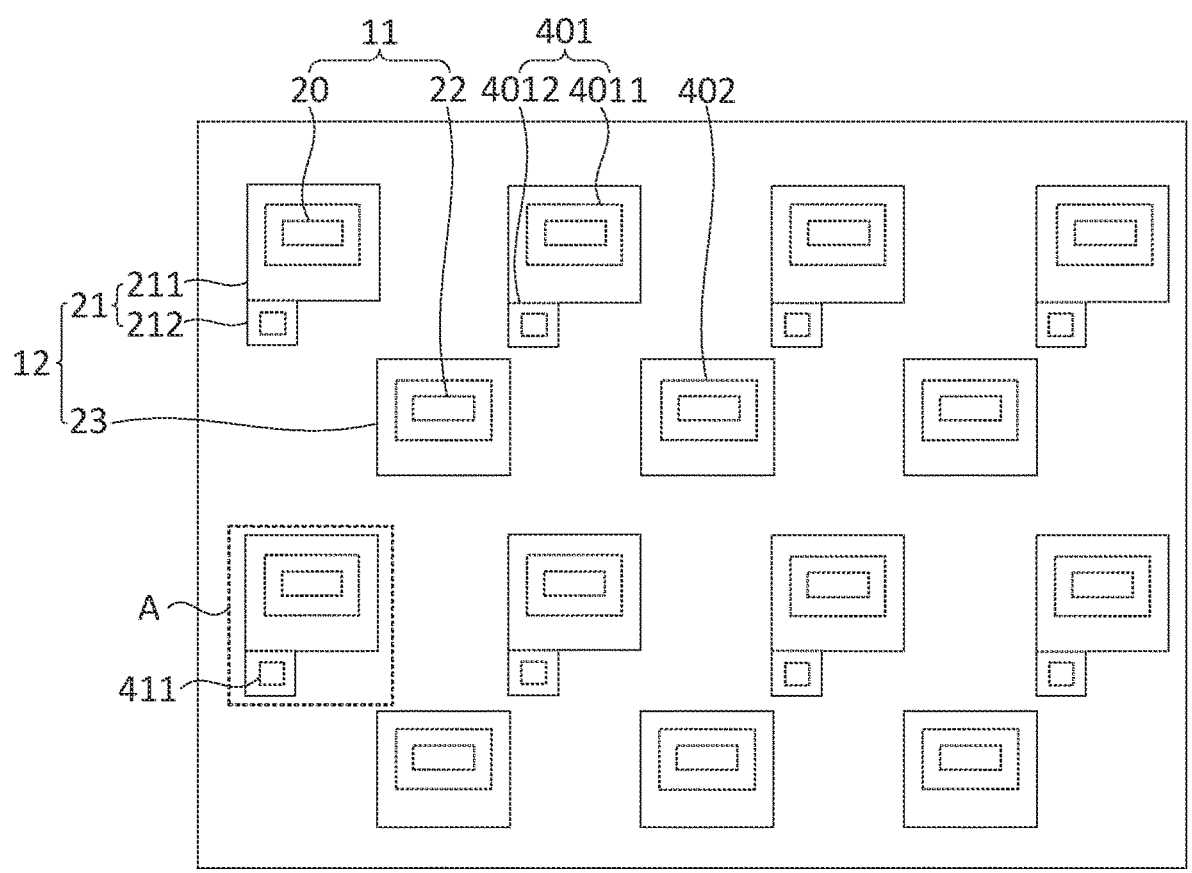
FIG. 1 is a structural view of a display panel according to an embodiment of the present disclosure.

The present disclosure is further described hereinafter in detail in conjunction with drawings and embodiments. It is to be understood that embodiments described hereinafter are intended to explain the present disclosure and not to limit the present disclosure. Additionally, it is to be noted that for ease of description, only part, not all, of structures related to the present disclosure are illustrated in the drawings.

Figure 2:
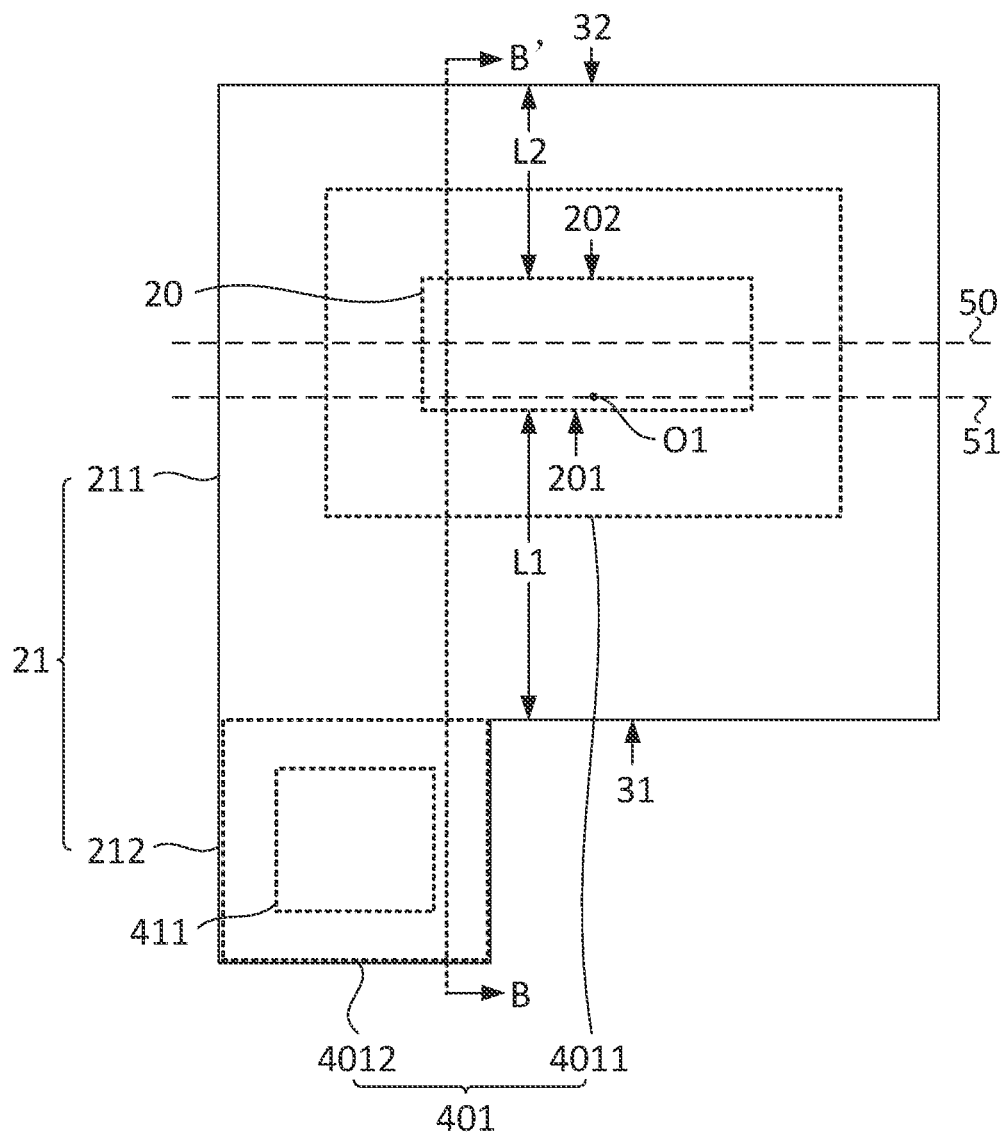
FIG. 2 is an enlarged structural view of region A in FIG. 1.
Figure 3:
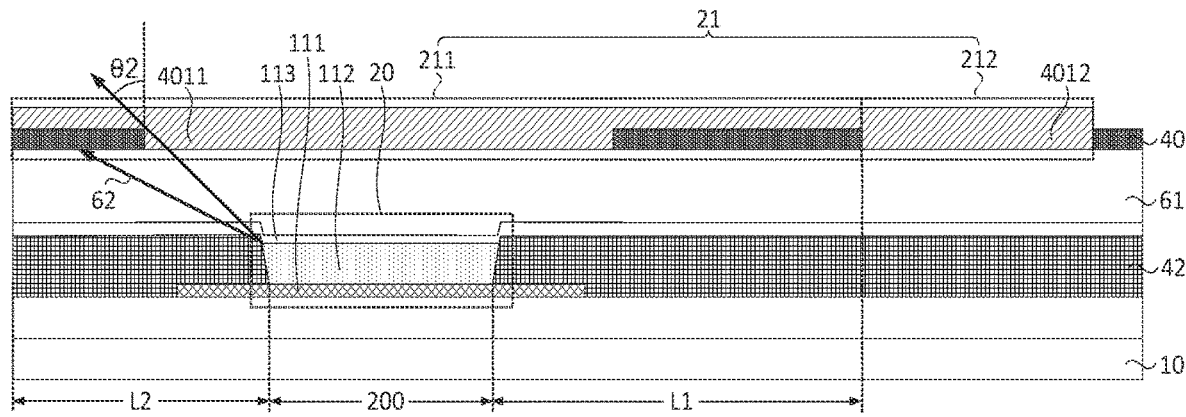
FIG. 3 is a sectional view taken along line B-B' in FIG. 2.

FIG. 1 is a structural view of a display panel according to an embodiment of the present disclosure. FIG. 2 is an enlarged structural view of region A in FIG. 1. FIG. 3 is a sectional view taken along line B-B' in FIG. 2. As shown in FIGS. 1 to 3, the display panel provided in the embodiment of the present disclosure includes a substrate 10, multiple light-emitting units 11 located on a side of the substrate 10, and multiple color-resist blocks 12 which are sequentially located on a side of the multiple light-emitting units 11 facing away from the substrate 10. The light-emitting unit 11 includes a first light-emitting unit 20, the color-resist block 12 includes a first color-resist block 21, and the first color-resist block 21 and the first light-emitting unit 20 are correspondingly disposed. The first color-resist block 21 includes a first display color-resist block 211 and a first imaging color-resist block 212. The vertical projection of the first display color-resist block 211 on a plane where the substrate 10 is located covers the vertical projection of the first light-emitting unit 20 on the plane where the substrate 10 is located. The first light-emitting unit 20 includes a first boundary 201 and a second boundary 202 which are disposed opposite to each other. Along a direction parallel to the plane where the substrate 10 is located, the first boundary 201 is located on a side of the second boundary 202 near the first imaging color-resist block 212. The first display color-resist block 211 includes a first edge 31 and a second edge 32 which are disposed opposite to each other. Along the direction parallel to the plane where the substrate 10 is located, the first edge 31 is located on a side of the second edge 32 near the first imaging color-resist block 212. Along the direction parallel to the plane where the substrate 10 is located, a maximum distance L1 between the first boundary 201 and the first edge 31 is greater than a maximum distance L2 between the second boundary 202 and the second edge 32.

In an embodiment, as shown in FIGS. 1 to 3, multiple light-emitting units 11 are disposed on a side of the substrate 10, and for example, in an organic light-emitting diode (OLED) display panel, the light-emitting unit 11 includes an anode layer 111, an organic light-emitting layer 112, and a cathode layer 113 which are laminated. Electrons and holes are injected into the organic light-emitting layer 112 from the cathode layer 113 and the anode layer 111, respectively, form excitons in the organic light-emitting layer 112, and excite light-emitting molecules to cause the organic light-emitting layer 112 to emit visible light, to realize the display function of the display panel.

With continued reference to FIGS. 1 to 3, multiple color-resist blocks 12 are also disposed on a side of the multiple light-emitting units 11 farther away from the substrate 10. The color-resist block 12 is used for filtering light whose color is different from the color of the color-resist block 12 itself in the light from the outside environment and plays a filtering role. The light emitted from the light-emitting unit 11 is transmitted through the color-resist block 12 to emit light of specific colors, to realize the color display of the display panel. Along a direction perpendicular to the plane where the substrate 10 is located, the color of a color-resist block 12 is the same as the color of the light emitted from a light-emitting unit 11 which overlaps with the color-resist block 12, to avoid light mixing. In other embodiments, the light-emitting unit 11 may also emit white light according to actual requirements.

It is to be noted that, as shown in FIG. 3, a black matrix 40 is also disposed on a side of the color-resist block 12 near the light-emitting unit 11 to block the metal wires in the display panel and prevent the light from the outside environment from being reflected to human eyes by the metal wires and affecting the display effect. The black matrix 40 is provided with an opening, and the color-resist block 12 described in the present application includes a part located in the opening of the black matrix 40 and a part located above the black matrix 40.

With continued reference to FIGS. 1 to 3, the light-emitting unit 11 includes a first light-emitting unit 20, and the color-resist block 12 includes a first color-resist block 21. The first color-resist block 21 is disposed correspondingly to the first light-emitting unit 20, that is, the light emitted from the first light-emitting unit 20 is transmitted through the first color-resist block 21 and then emitted. The first color-resist block 21 includes a first display color-resist block 211 and a first imaging color-resist block 212. The vertical projection of the first display color-resist block 211 on the plane where the substrate 10 is located covers the vertical projection of the first light-emitting unit 20 on the plane where the substrate 10 is located so that the light emitted from the first light-emitting unit 20 is mainly transmitted through the first display color-resist block 211 and then emitted. The first imaging color-resist block 212 is used for forming an optical path, and such an optical path is used for allowing light from the outside environment to pass through. Meanwhile, since the cathode layer 113 on the side of the first imaging color-resist block 212 near the substrate 10 has a reflectivity of about 50%, in this embodiment, the optical path is shielded by the first imaging color-resist block 212 to some extent so that the reflected light of the cathode layer 113 emitted from the optical path can be reduced, to improve the display effect of the display panel.

With continued reference to FIGS. 1 to 3, the first light-emitting unit 20 includes a first boundary 201 and a second boundary 202 which are disposed opposite to each other. Along the direction parallel to the plane where the substrate 10 is located, the first boundary 201 is located on a side of the second boundary 202 near the first imaging color-resist block 212. It is to be noted that the first light-emitting unit 20 includes a first opening region 200 which is an effective light-emitting region of the first light-emitting unit 20, that is, the effective light-emitting region is a region where the organic light-emitting layer 112 overlaps with the anode layer 111 and the cathode layer 113. In the present application, the boundaries of the first light-emitting unit 20 refer to the boundaries of the first opening region 200.

With continued reference to FIGS. 1 to 3, the first display color-resist block 211 includes a first edge 31 and a second edge 32 which are disposed opposite to each other. Along the direction parallel to the plane where the substrate 10 is located, the first edge 31 is located on a side of the second edge 32 near the first imaging color-resist block 212.

As mentioned earlier, in the display panel provided by the embodiment of the present application, based on the principle of pinhole imaging, the first imaging color-resist block 212 is used for forming an optical path, and first imaging color-resist blocks 212 of multiple first color-resist blocks 21 are arranged in an array to form a matrix pinhole imaging system (MAPIS). For example, when the preset functional element is a fingerprint identification element, the fingerprint identification element needs to receive feedback light irradiated on the finger of the user and carrying fingerprint information and then perform imaging according to the feedback light to obtain the fingerprint information. The feedback light is transmitted to the surface of the fingerprint identification element through the optical path formed by the first imaging color-resist block 212, to satisfy the demand of the fingerprint identification element for light collection and improve the working sensitivity of the fingerprint identification element.

However, the inventor found that, due to the presence of the first imaging color-resist block 212, part of the light of a large viewing angle of the first light-emitting unit 20 is leaked through the first imaging color-resist block 212 so that the light emitted from the first color-resist block 21 is more than the light emitted from other color-resist blocks of the same color and the display brightness of the first color-resist block 21 is visually significantly different from the display brightness of other color-resist blocks of the same color, which causes poor brightness uniformity of the display panel and brings bad use experience to users.

Therefore, with continued reference to FIGS. 1-3, in this embodiment, along the direction parallel to the plane in which the substrate 10 is located, the maximum distance L1 between the first boundary 201 and the first edge 31 is greater than the maximum distance L2 between the second boundary 202 and the second edge 32. Therefore, the distance between the first boundary 201 on a side of the first light-emitting unit 20 near the first imaging color-resist block 212 and the first edge 31 on a side of the first display color-resist block 211 near the first imaging color-resist block 212 is relatively far, which makes the first boundary 201 on the side of the first light-emitting unit 20 near the first imaging color-resist block 212 farther away from the first imaging color-resist block 212, and light emitted from the first light-emitting unit 20 is not easily leaked through the first imaging color-resist block 212 to reduce light of a large viewing angle leaked through the first imaging color-resist block 212, to improve the brightness uniformity of the display panel.

It is to be noted that in FIG. 3, in order to clearly show the relative positional relationship between the first light-emitting unit 20 and the first color-resist block 21, only related film layers such as the first light-emitting unit 20 and the first color-resist block 21 are shown while no other film layers are shown.

In conclusion, in the display panel provided by the embodiment of the present disclosure, a first color-resist block 21 and a first light-emitting unit 20 are correspondingly disposed, the first color-resist block 21 includes a first display color-resist block 211 and a first imaging color-resist block 212, the vertical projection of the first display color-resist block 211 on the plane where the substrate 10 is located covers the vertical projection of the first light-emitting unit 20 on the plane where the substrate 10 is located, and along the direction parallel to the plane where the substrate 10 is located, the maximum distance L1 between the first boundary 201 of the first light-emitting unit 20 near the first imaging color-resist block 212 and the first edge 31 on a side of the first display color-resist block 211 near the first imaging color-resist block 212 is set to be greater than the maximum distance L2 between the second boundary 202 of the first light-emitting unit 20 farther away from the first imaging color-resist block 212 and the second edge 32 on a side of the first display color-resist block 211 farther away from the first imaging color-resist block 212. Therefore, the distance between the first light-emitting unit 20 and the first imaging color-resist block 212 is relatively far so that the light emitted from the first light-emitting unit 20 is not easily leaked through the first imaging color-resist block 212, to reduce light of a large viewing angle leaked through the first imaging color-resist block 212, to improve the brightness uniformity of the display panel.

With continued reference to FIGS. 1 to 3, in an embodiment, along the direction parallel to the plane where the substrate 10 is located, a first symmetry axis 50 of the first light-emitting unit 20 is located on a side of a first central axis 52 of the first display color-resist block 211 farther away from the first imaging color-resist block 212. The shortest distance from any point on the first boundary 201 to the first symmetry axis 50 is equal to the shortest distance from any point on the second boundary 202 to the first symmetry axis 50. The first central axis 51 passes through a center point O1 of the first display color-resist block 211 and is parallel to the first symmetry axis 50.

In an embodiment, as shown in FIG. 2, along the direction parallel to the plane where the substrate 10 is located, the first symmetry axis 50 of the first light-emitting unit 20 is set to be located on a side of the first central axis 51 of the first display color-resist block 211 farther away from the first imaging color-resist block 212 so that the first light-emitting unit 20 is disposed toward the second edge 32 on a side of the first display color-resist block 211 farther away from the first imaging color-resist block 212. Therefore, the distance between the first light-emitting unit 20 and the first imaging color-resist block 212 is relatively far, and the light emitted from the first light-emitting unit 20 is not easily leaked through the first imaging color-resist block 212, to reduce the light of a large viewing angle leaked through the first imaging color-resist block 212, to improve the brightness uniformity of the display panel.

The shortest distance between the first symmetry axis 50 and the first central axis 51 may be set according to actual requirements. For example, the shortest distance between the first symmetry axis 50 and the first central axis 51 is set to 4 μm to 7 μm, for example, 6 μm, which is not limited in the embodiments of the present disclosure.

It should be noted that the center point O1 of the first display color-resist block 211 refers to the geometric center of the first display color-resist block 211, and the "parallel" described in the present application includes being approximate parallel within the allowable range of process accuracy, which will not be described in detail in subsequent embodiments.

Figure 4:
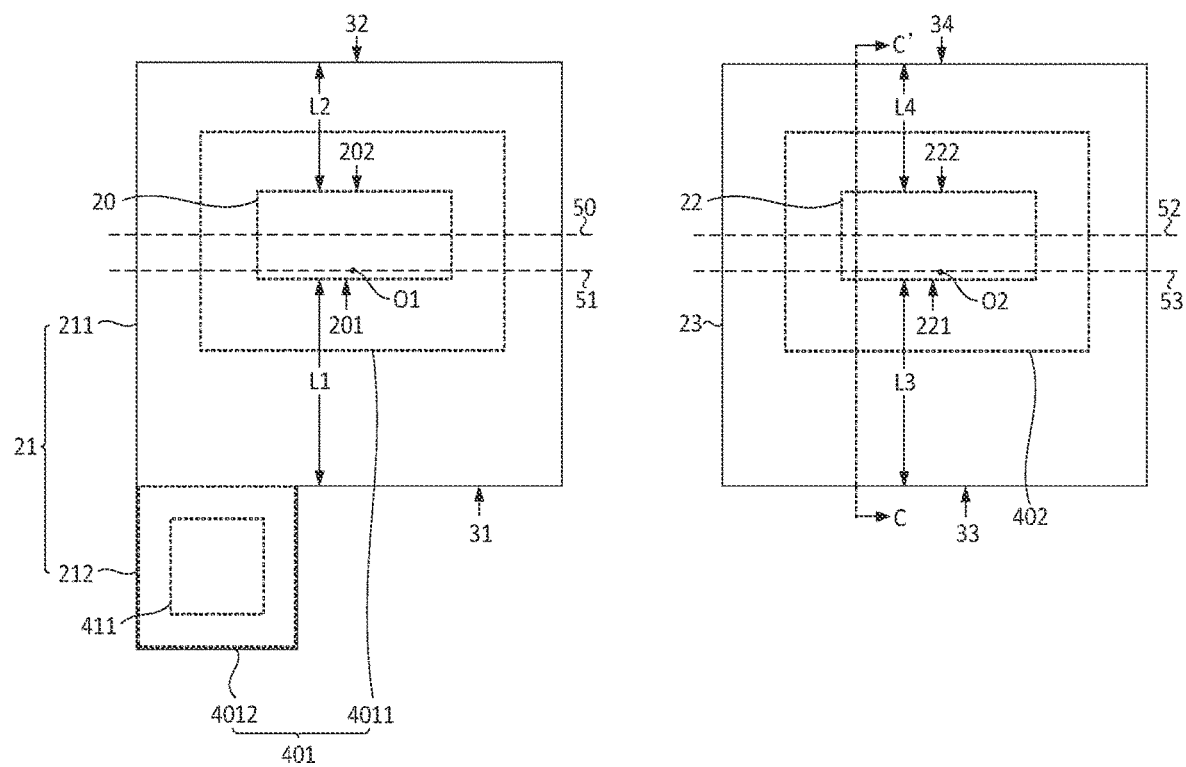
FIG. 4 is a partial structural view of a display panel according to an embodiment of the present disclosure.
Figure 5:
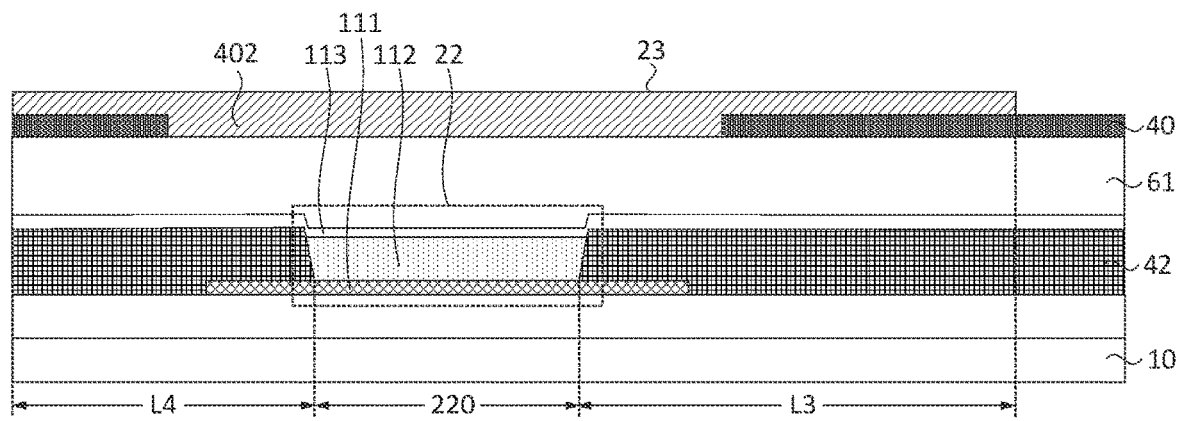
FIG. 5 is a sectional view taken along direction C-C' in FIG. 4.

FIG. 4 is a partial structural view of a display panel according to an embodiment of the present disclosure. FIG. 5 is a sectional view taken along direction C-C' in FIG. 4. As shown in FIGS. 1, 4, and 5, in an embodiment, the light-emitting unit 11 further includes a second light-emitting unit 22. The emitted color of the second light-emitting unit 22 is the same as the emitted color of the first light-emitting unit 20. The color-resist block further includes a second color-resist block 23. The second color-resist block 23 is disposed correspondingly to the second light-emitting unit 22. The vertical projection of the second color-resist block 23 on the plane where the substrate 10 is located covers the vertical projection of the second light-emitting unit 22 on the plane where the substrate 10 is located. The second light-emitting unit 22 includes a third boundary 221 and a fourth boundary 222 which are disposed opposite to each other. The second color-resist block 23 includes a third edge 33 and a fourth edge 34 which are disposed opposite to each other. Along the direction parallel to the plane where the substrate 10 is located, the third edge 33 is located on a side of the third boundary 221 farther away from the fourth boundary 222, and the fourth edge 34 is located on a side of the fourth boundary 222 farther away from the third boundary 221. Along the direction parallel to the plane where the substrate 10 is located, the maximum distance L3 between the third boundary 221 and the third edge 33 is greater than the maximum distance L4 between the fourth boundary 222 and the fourth edge 34.

In an embodiment, as shown in FIGS. 4 and 5, the light-emitting unit 11 further includes a second light-emitting unit 22 whose emitted color is the same as the emitted color of the first light-emitting unit 20, and the color-resist block 12 also includes a second color-resist block 23 disposed correspondingly to the second light-emitting unit 22. The vertical projection of the second color-resist block 23 on the plane where the substrate 10 is located covers the vertical projection of the second light-emitting unit 22 on the plane where the substrate 10 is located so that the light emitted from the second light-emitting unit 22 is emitted through the second color-resist block 23. The arrangement of the first imaging color-resist blocks 212 is set according to the object-image distance of the display panel, and the light-emitting unit 11 includes a second light-emitting unit 22 near which an optical path for allowing light from the outside environment to pass through is not set, so that the distance between the adjacent first imaging color-resist blocks 212 is not too small to cause crosstalk between the adjacent optical paths.

With continued reference to FIGS. 4 and 5, the second light-emitting unit 22 includes a third boundary 221 and a fourth boundary 222 which are disposed opposite to each other. It is to be noted that the second light-emitting unit 22 includes a second opening region 220 is an effective light-emitting region of the second light-emitting unit 22, that is, the effective light-emitting region is a region where the organic light-emitting layer 112 overlaps with the anode layer 111 and the cathode layer 113. In the present application, the boundaries of the second light-emitting unit 22 refer to the boundaries of the second opening region 200.

With continued reference to FIGS. 4 and 5, the second color-resist block 23 includes a third edge 33 and a fourth edge 34 which are disposed opposite to each other. Along the direction parallel to the plane where the substrate 10 is located, the third edge 31 is located on a side of the third boundary 221 farther away from the fourth boundary 222, and the fourth edge 34 is located on a side of the fourth boundary 222 farther away from the third boundary 221. In this embodiment, along the direction parallel to the plane where the substrate 10 is located, the maximum distance L3 between the third boundary 221 and the third edge 33 is set to be greater than the maximum distance L4 between the fourth boundary 222 and the fourth edge 34 so that the relative positional relationship between the second light-emitting unit 22 and the second color-resist block 23 is consistent with the relative positional relationship between the first light-emitting unit 20 and the first display color-resist block 211, to reduce the difference in display brightness between the first light-emitting unit 20 and the second light-emitting unit 22, to improve the brightness uniformity of the display panel.

It is to be noted that the relative positional relationship between the first light-emitting unit 20 and the second light-emitting unit 22 shown in FIGS. 1 and 4 is just an example, and in other embodiments, the arrangement of the first light-emitting unit 20 and the second light-emitting unit 22 may be set according to actual requirements, which is not limited in the embodiments of the present disclosure.

With continued reference to FIG. 4, in an embodiment, along the direction parallel to the plane where the substrate 10 is located, a second symmetry axis 52 of the second light-emitting unit 22 is located on a side of a second central axis 53 of the second color-resist block 23 near the fourth boundary 222. The shortest distance from any point on the third boundary 221 to the second symmetry axis 52 is equal to the shortest distance from any point on the fourth boundary 222 to the second symmetry axis 52. The second central axis 53 passes through a center point O2 of the second color-resist block 23 and is parallel to the second symmetry axis 52.

As shown in FIG. 4, along the direction parallel to the plane where the substrate 10 is located, the second symmetry axis 52 of the second light-emitting unit 22 is set to be located on a side of the second central axis 53 of the second color-resist block 23 near the fourth boundary 222 so that the relative positional relationship between the second light-emitting unit 22 and the second color-resist block 23 is consistent with the relative positional relationship between the first light-emitting unit 20 and the first display color-resist block 211, to further reduce the difference in display brightness between the first light-emitting unit 20 and the second light-emitting unit 22, to improve the brightness uniformity of the display panel.

It is to be noted that the center point O2 of the second color-resist block 23 refers to the geometric center of the second color-resist block 23, which will not be described in detail in subsequent embodiments.

Figure 6:
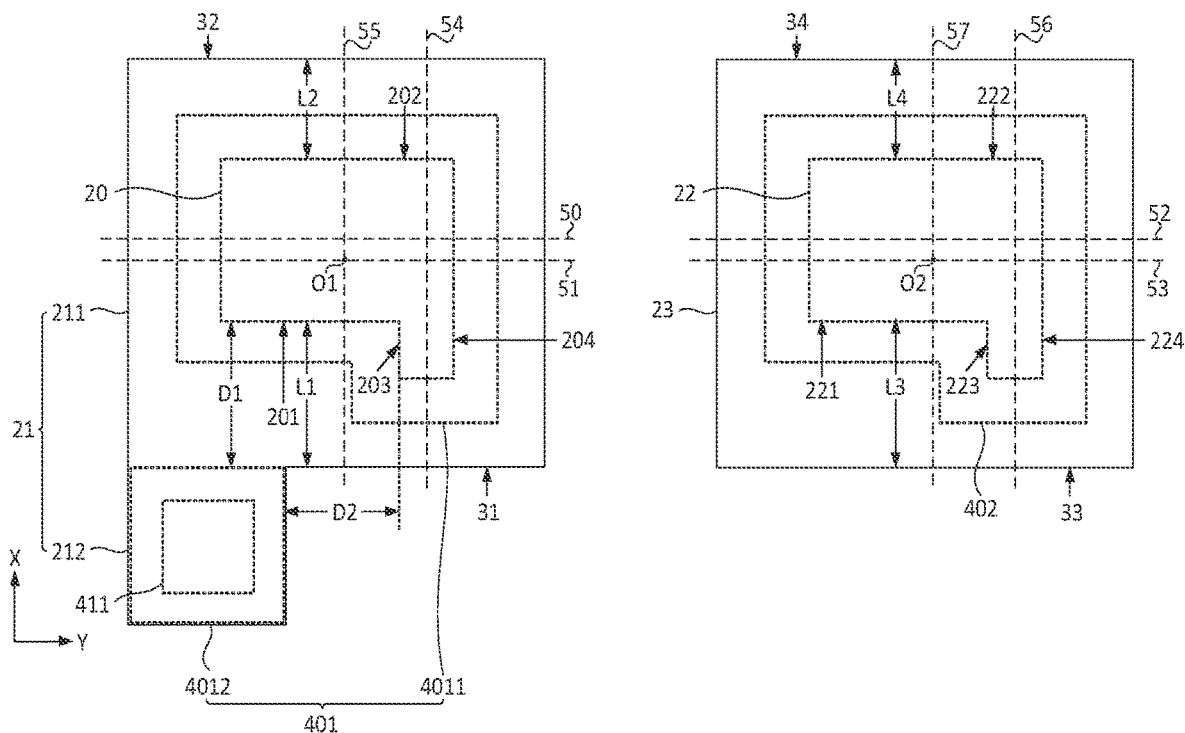
FIG. 6 is a partial structural view of another display panel according to an embodiment of the present disclosure.

FIG. 6 is a partial structural view of another display panel according to an embodiment of the present disclosure. As shown in FIG. 6, in an embodiment, the first light-emitting unit 20 further includes a fifth boundary 203 and a sixth boundary 204 which are disposed opposite to each other. Along the direction parallel to the plane where the substrate 10 is located, the fifth boundary 203 is located on a side of the sixth boundary 204 near the first imaging color-resist block 212. The fifth boundary 203 intersects with the first boundary 201, and the sixth boundary 204 intersects with the second boundary 202. Along the direction parallel to the plane where the substrate 10 is located, a third symmetry axis 54 of the first light-emitting unit 20 is located on a side of a third central axis 55 of the first display color-resist block 211 farther away from the first imaging color-resist block 212. The shortest distance from any point on the fifth boundary 203 to the third symmetry axis 54 is equal to the shortest distance from any point on the sixth boundary 204 to the third symmetry axis 54, and the third central axis 55 passes through the center point O1 of the first display color-resist block 211 and is parallel to the third symmetry axis 54.

In an embodiment, as shown in FIG. 6, along the direction parallel to the plane where the substrate 10 is located, the third symmetry axis 54 of the first light-emitting unit 20 is set to be located on a side of the third central axis 55 of the first display color-resist block 211 farther away from the first imaging color-resist block 212 so that the first light-emitting unit 20 is disposed toward a side of the first display color-resist block 211 farther away from the first imaging color-resist block 212 along a direction parallel to the first symmetry axis 50. Therefore, the distance between the first light-emitting unit 20 and the first imaging color-resist block 212 is relatively far, and the light emitted from the first light-emitting unit 20 is not easily leaked through the first imaging color-resist block 212, to reduce the light of a large viewing angle leaked through the first imaging color-resist block 212, to improve the brightness uniformity of the display panel.

With continued reference to FIG. 6, in an embodiment, the shortest distance between the first boundary 201 and the first imaging color-resist block 212 along a first direction X is D1, and the shortest distance between the fifth boundary 203 and the first imaging color-resist block 212 along a second direction Y is D2, where D1=D2, the first direction X is parallel to the third symmetry axis 54, and the second direction Y is parallel to the first symmetry axis 50.

As shown in FIG. 6, the shortest distance D1 between the first boundary 201 and the first imaging color-resist block 212 is set to be equal to the shortest distance D2 between the fifth boundary 203 and the first imaging color-resist block 212 so that a field angle of the light of a large viewing angle emitted from the first light-emitting unit 20 along the first direction X is consistent with a field angle of the light of a large viewing angle emitted from the first light-emitting unit 20 along the second direction Y while reducing the light of a large viewing angle leaked through the first imaging color-resist block 212. Therefore, the light of a large viewing angle emitted from the first light-emitting unit 20 through the first imaging color-resist block 212 along the first direction Xis reduced, and the light of a large viewing angle emitted from the first light-emitting unit 20 through the first imaging color-resist block 212 along the second direction Y is also reduced, to improve the brightness uniformity of the display panel both in the viewing angle range along the first direction X and in the viewing angle range along the second direction Y.

With continued reference to FIG. 6, in an embodiment, along the direction parallel to the plane where the substrate 10 is located, the shape of a boundary of the first light-emitting unit 20 on a side near the first imaging color-resist block 212 is complementary to the shape of a boundary of the first imaging color-resist block 212 on a side near the first light-emitting unit 20.

As shown in FIG. 6, the shape of the boundary of the first light-emitting unit 20 on a side near the first imaging color-resist block 212 is set to be complementary to the shape of the boundary of the first imaging color-resist block 212 on a side near the first light-emitting unit 20 so that the shape of the boundary of the first light-emitting unit 20 on a side near the first imaging color-resist block 212 coincides with the shape of the boundary of the first imaging color-resist block 212 on a side near the first light-emitting unit 20, to make full use of the space of the display panel and increase the effective light-emitting area of the first light-emitting unit 20, to facilitate the improving of the luminescence efficiency of the first light-emitting unit 20, improving the luminescence efficiency of the display panel 10, and ensuring a good display effect of the display panel.

With continued reference to FIG. 6, in an embodiment, the light-emitting unit 11 further includes a second light-emitting unit 22. The emitted color of the second light-emitting unit 22 is the same as the emitted color of the first light-emitting unit 20. The color-resist block 12 further includes a second color-resist block 23. The second color-resist block 23 is disposed correspondingly to the second light-emitting unit 22. The vertical projection of the second color-resist block 23 on the plane where the substrate 10 is located covers the vertical projection of the second light-emitting unit 22 on the plane where the substrate 10 is located. The second light-emitting unit 22 includes a third boundary 221 and a fourth boundary 222 which are disposed opposite to each other. Along the direction parallel to the plane where the substrate 10 is located, a second symmetry axis 52 of the second light-emitting unit 22 is located on a side of a second central axis 53 of the second color-resist block 23 near the fourth boundary 222. The second light-emitting unit 22 further includes a seventh boundary 223 and an eighth boundary 224 which are disposed opposite to each other. Along the direction parallel to the plane where the substrate 10 is located, the seventh boundary 223 intersects with the third boundary 221, and the eighth boundary 224 intersects with the fourth boundary 222. Along the direction parallel to the plane where the substrate 10 is located, a fourth symmetry axis 56 of the second light-emitting unit 22 is located on a side of a fourth central axis 57 of the second color-resist block 23 farther away from the eighth boundary 224. The shortest distance from any point on the third boundary 221 to the second symmetry axis 52 is equal to the shortest distance from any point on the fourth boundary 222 to the second symmetry axis 52, and the second central axis 53 passes through the center point O2 of the second color-resist block 23 and is parallel to the second symmetry axis 52; the shortest distance from any point on the seventh boundary 223 to the fourth symmetry axis 56 is equal to the shortest distance from any point on the eighth boundary 224 to the fourth symmetry axis 56, and the fourth central axis 57 passes through the center point O2 of the second color-resist block 23 and is parallel to the fourth symmetry axis 56.

In an embodiment, as shown in FIG. 6, the light-emitting unit 11 further includes a second light-emitting unit 22 whose emitted color is the same as the emitted color of the first light-emitting unit 20, and the color-resist block 12 also includes a second color-resist block 23 disposed correspondingly to the second light-emitting unit 22. The vertical projection of the second color-resist block 23 on the plane where the substrate 10 is located covers the vertical projection of the second light-emitting unit 22 on the plane where the substrate 10 is located so that the light emitted from the second light-emitting unit 22 is emitted through the second color-resist block 23.

With continued reference to FIG. 6, the second light-emitting unit 22 includes a third boundary 221 and a fourth boundary 222 which are disposed opposite to each other as well as a seventh boundary 223 and an eighth boundary 224 which are disposed opposite to each other, and along the direction parallel to the plane where the substrate 10 is located, the seventh boundary 223 intersects with the third boundary 221, and the eighth boundary 224 intersects with the fourth boundary 222. In this embodiment, along the direction parallel to the plane where the substrate 10 is located, the fourth symmetry axis 56 of the second light-emitting unit 22 is set to be located on a side of the fourth central axis 57 of the second color-resist block 23 near the eighth boundary 224, and the second symmetry axis 52 of the second light-emitting unit 22 is set to be located on a side of the second central axis 53 of the second color-resist block 23 near the fourth boundary 222, so that the relative positional relationship between the second light-emitting unit 22 and the second color-resist block 23 is consistent with the relative positional relationship between the first light-emitting unit 20 and the first display color-resist block 211, to reduce the difference in display brightness between the first light-emitting unit 20 and the second light-emitting unit 22, to improve the brightness uniformity of the display panel.

With continued reference to FIGS. 4 and 6, in an embodiment, the area of the first light-emitting unit 20 is equal to the area of the second light-emitting unit 22.

As shown in FIGS. 4 and 6, the area of the first light-emitting unit 20 is set to be equal to the area of the second light-emitting unit 22 so that the effective light-emitting area of the first light-emitting unit 20 is consistent with the effective light-emitting area of the second light-emitting unit 22, to reduce the difference in display brightness between the first light-emitting unit 20 and the second light-emitting unit 22, to improve the brightness uniformity of the display panel.

It is to be noted that the area of the first light-emitting unit 20 in the present application refers to the area of the effective light-emitting region of the first light-emitting unit 20, and the area of the second light-emitting unit 22 refers to the area of the effective light-emitting region of the second light-emitting unit 22.

With continued reference to FIGS. 4 and 6, in an embodiment, the area of the first display color-resist block 211 is equal to the area of the second color-resist block 23.

As shown in FIGS. 4 and 6, in an ideal situation, the light emitted from the first light-emitting unit 20 is transmitted through the first display color-resist block 211 and then emitted, the light emitted from the second light-emitting unit 22 is emitted through the second color-resist block 23. In this embodiment, the area of the first display color-resist block 211 is set to be equal to the area of the second color-resist block 23 so that the field angle of the light emitted from the first light-emitting unit 20 through the first display color-resist block 211 is consistent with the field angle of the light emitted from the second light-emitting unit 22 through the second color-resist block 23, to reduce the difference in display brightness between the first light-emitting unit 20 and the second light-emitting unit 22 at a large viewing angle, to improve the brightness uniformity of the display panel.

Figure 7:
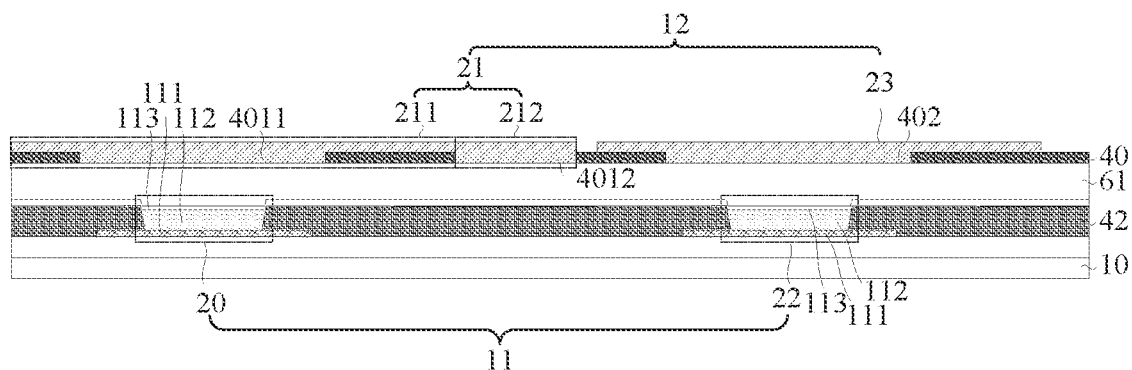
FIG. 7 is a partial sectional view of a display panel according to an embodiment of the present disclosure.

FIG. 7 is a partial sectional view of a display panel according to an embodiment of the present disclosure. As shown in FIGS. 1 to 7, in an embodiment, the display panel provided by the embodiment of the present disclosure further includes a black matrix 40. The black matrix 40 is located on a side of the multiple color-resist blocks 12 near the multiple light-emitting units 11 and is disposed between two adjacent ones of the multiple color-resist blocks 12. The black matrix 40 includes a first opening 401 and a second opening 402. The first opening 401 includes a first sub-opening 4011 and a second sub-opening 4012. The first display color-resist block 211 covers the first sub-opening 4011. The first imaging color-resist block 212 covers the second sub-opening 4012. The second color-resist block 23 covers the second opening 402. The area of the first sub-opening 4011 is equal to the area of the second opening 402.

As shown in FIGS. 1 to 7, a black matrix 40 is also disposed on a side of the multiple color-resist blocks 12 near the multiple light-emitting units 11, and the black matrix 40 may be disposed between two adjacent color-resist blocks 12 to block the metal wires in the display panel and prevent the light from the outside environment from being reflected to human eyes by the metal wires and affecting the display effect. The black matrix 40 is provided with a first opening 401 and a second opening 402. The first opening 401 includes a first sub-opening 4011 and a second sub-opening 4012. The first sub-opening 4011 is used for allowing the light emitted from the first light-emitting unit 20 to pass through for display. The second sub-opening 4012 is used for cooperating with the first imaging color-resist block 212 to form an optical path to satisfy the working requirements of the preset functional element through light from the outside environment. The second opening 402 is used for allowing the light emitted from the second light-emitting unit 22 to pass through for display.

With continued reference to FIGS. 1 and 7, in this embodiment, the area of the first sub-opening 4011 is equal to the area of the second opening 402 so that the field angle of light emitted from the first light-emitting unit 20 through the first sub-opening 4011 is consistent with the field angle of light emitted from the second light-emitting unit 22 through the second opening 402, to reduce the difference in display brightness between the first light-emitting unit 20 and the second light-emitting unit 22 at a large viewing angle, to improve the brightness uniformity of the display panel.

Figure 8:
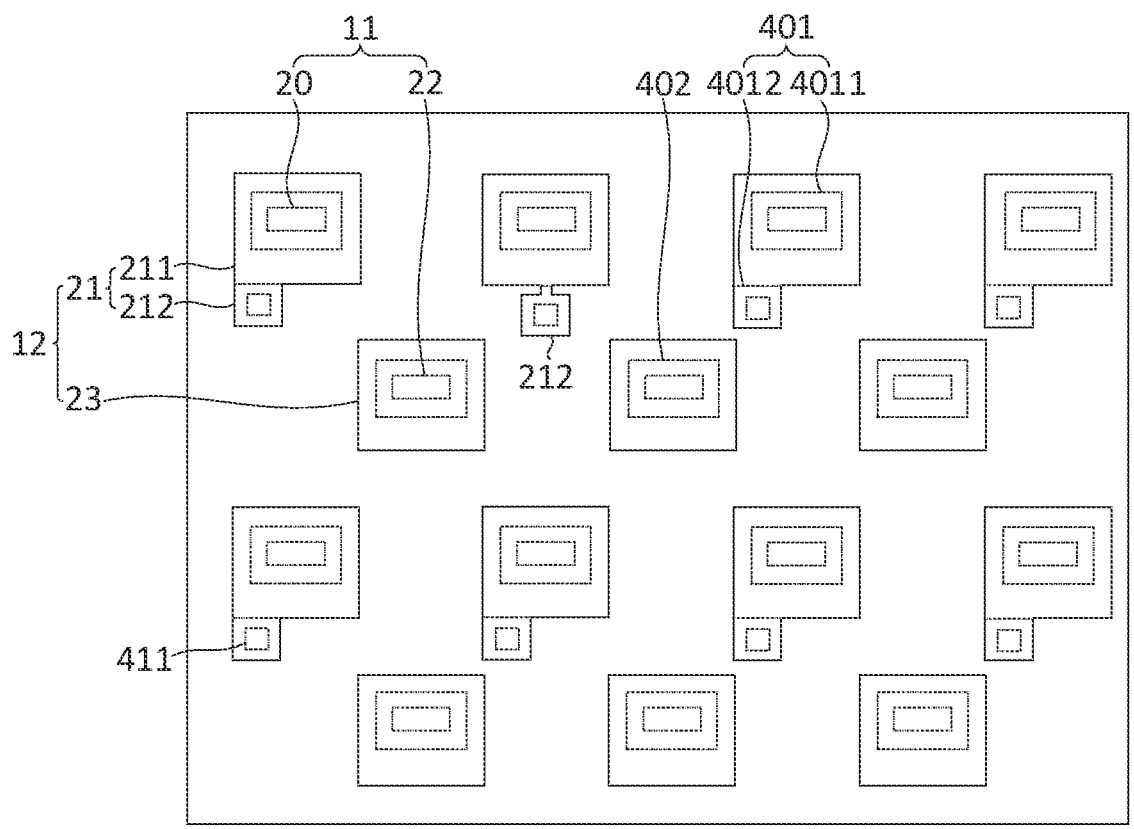
FIG. 8 is a partial structural view of still another display panel according to an embodiment of the present disclosure.

FIG. 8 is a partial structural view of still another display panel according to an embodiment of the present disclosure. As shown in FIG. 8, in an embodiment, at least two of the second sub-openings 4012 have different shapes.

As shown in FIG. 8, the different shapes of the second sub-openings 4012 can satisfy the requirements of different positions of the preset functional element for light and satisfy the working requirements of the preset functional element.

It is to be noted that the shape of the second sub-opening 4012 may be set according to actual requirements, for example, the shape of the second sub-opening 4012 may be set to rectangular, trapezoidal, circular or oval, which is not limited in the embodiments of the present disclosure.

Figure 9:
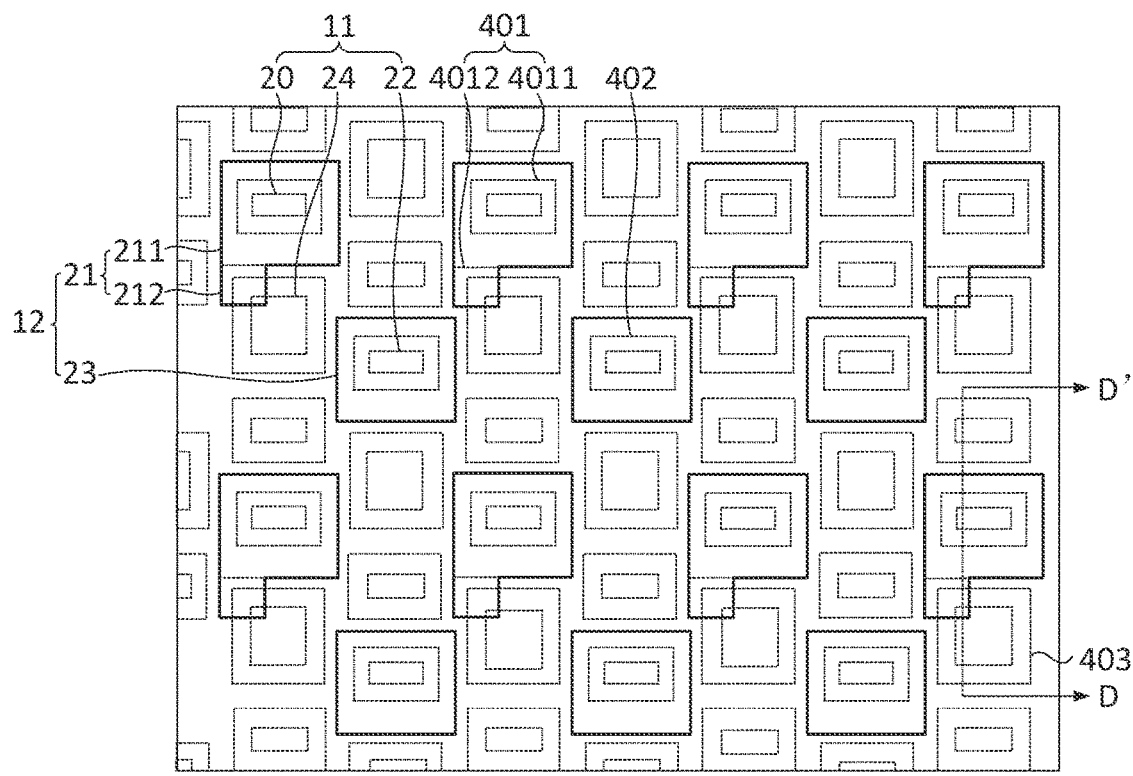
FIG. 9 is a partial structural view of yet another display panel according to an embodiment of the present disclosure.
Figure 10:
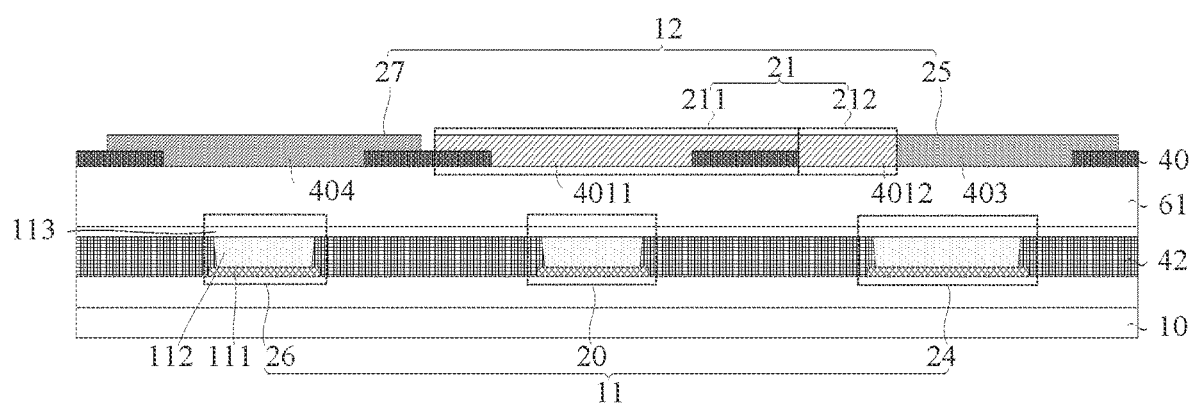
FIG. 10 is a sectional view taken along direction D-D' in FIG. 9.

FIG. 9 is a partial structural view of yet another display panel according to an embodiment of the present disclosure. FIG. 10 is a sectional view taken along direction D-D' in FIG. 9. As shown in FIGS. 9 and 10, in an embodiment, the light-emitting unit 11 further includes a third light-emitting unit 24, the color-resist block 12 includes a third color-resist block 25. The third color-resist block 25 and the third light-emitting unit 24 are correspondingly disposed. The color of the third color-resist block 25 is different from the color of the first color-resist block 21. The vertical projection of the second sub-opening 4012 on the substrate at least partially overlaps with the vertical projection of the third light-emitting unit 24 adjacent to the second sub-opening 4012 on the substrate.

As shown in FIGS. 9 and 10, the display panel is further provided with a third light-emitting unit 24 and a third color-resist block 25 which is disposed correspondingly to the third light-emitting unit 24. The vertical projection of the third color-resist block 25 on the plane where the substrate 10 is located covers the vertical projection of the third light-emitting unit 24 on the plane where the substrate 10 is located. The light emitted from the third light-emitting unit 24 is transmitted through the third color-resist block 25 and then emitted.

With continued reference to FIGS. 9 and 10, when the arrangement of the openings of the black matrix 40 is too dense due to the dense arrangement of the light-emitting units 11, there may be a problem that the space between the adjacent openings is too small. In this embodiment, the second sub-opening 4012 and the third light-emitting unit 24 adjacent to the second sub-opening 4012 are arranged in a manner of partially overlapping to satisfy the working requirements of the preset functional element.

Meanwhile, since the color of the third color-resist block 25 is different from the color of the first color-resist block 21, the light of a large viewing angle emitted from the third light-emitting unit 24 is not leaked through the first imaging color-resist block 212 of the first color-resist block 21 so that the light emitted from the third color-resist block 25 is not more than the light emitted from other color-resist blocks of the same color. Therefore, the display brightness of the third color-resist block 25 is not visually significantly different from the display brightness of other color-resist blocks, and the brightness uniformity of the display panel is not greatly affected.

With continued reference to FIGS. 9 and 10, in an embodiment, the black matrix 40 further includes a fifth opening 403. The fifth opening 403 is covered by the third color-resist block 25. The vertical projection of the second sub-opening 4012 on the substrate at least partially overlaps with the vertical projection of the fifth opening 403 adjacent to the second sub-opening 4012 on the substrate.

With continued reference to FIGS. 9 and 10, the fifth opening 403 is used for allowing the light emitted from the third light-emitting unit 24 to pass through for display. When the arrangement of the openings of the black matrix 40 is too dense due to the dense arrangement of the light-emitting units 11, there may be a problem that the space between the adjacent openings of the black matrix 40 is too small. In this embodiment, the second sub-opening 4012 and the fifth opening 403 adjacent to the second sub-opening 4012 are arranged in a manner of partially overlapping to satisfy the working requirements of the preset functional element.

With continued reference to FIGS. 9 and 10, in an embodiment, the light-emitting unit 11 may further include a fourth light-emitting unit 26, and the color-resist block 12 may include a fourth color-resist block 27. The fourth color-resist block 27 is disposed correspondingly to the fourth light-emitting unit 26. The color of the fourth color-resist block 27 is different from the colors of both the first color-resist block 21 and the third color-resist block 25. The black matrix 40 may further include a sixth opening 404. The sixth opening 404 is covered by the fourth color-resist block 27.

As shown in FIGS. 9 and 10, the display panel is further provided with a fourth light-emitting unit 26 and a fourth color-resist block 27 which is disposed correspondingly to the fourth light-emitting unit 26. The vertical projection of the fourth color-resist block 27 on the plane where the substrate 10 is located covers the vertical projection of the fourth light-emitting unit 26 on the plane where the substrate 10 is located. The light emitted from the fourth light-emitting unit 26 is transmitted through the fourth color-resist block 27 and then emitted. The sixth opening 404 is used for allowing the light emitted from the fourth light-emitting unit 26 to pass through for display. The color of the fourth color-resist block 27 is different from the colors of both the first color-resist block 21 and the third color-resist block 25 so that the display panel can emit light of three colors, to realize the color display.

It is to be noted that the color and arrangement of the light-emitting units 11 and the color-resist blocks 12 can be set according to the actual requirements. For example, as shown in FIGS. 9 and 10, the first color-resist block 21 is a green color-resist block, the third color-resist block 25 is a blue color-resist block, and the fourth color-resist block 27 is a red color-resist block, which is not limited in the embodiments of the present disclosure.

Figure 11:
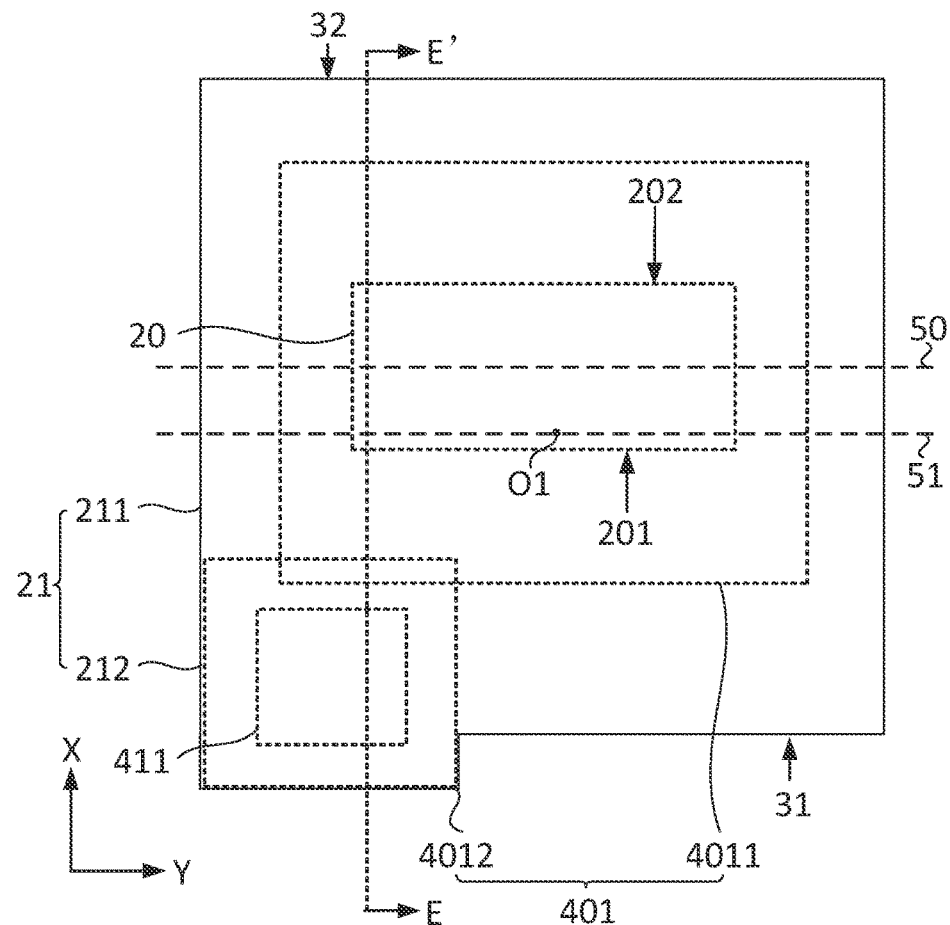
FIG. 11 is a partial structural view of still another display panel according to an embodiment of the present disclosure.
Figure 12:
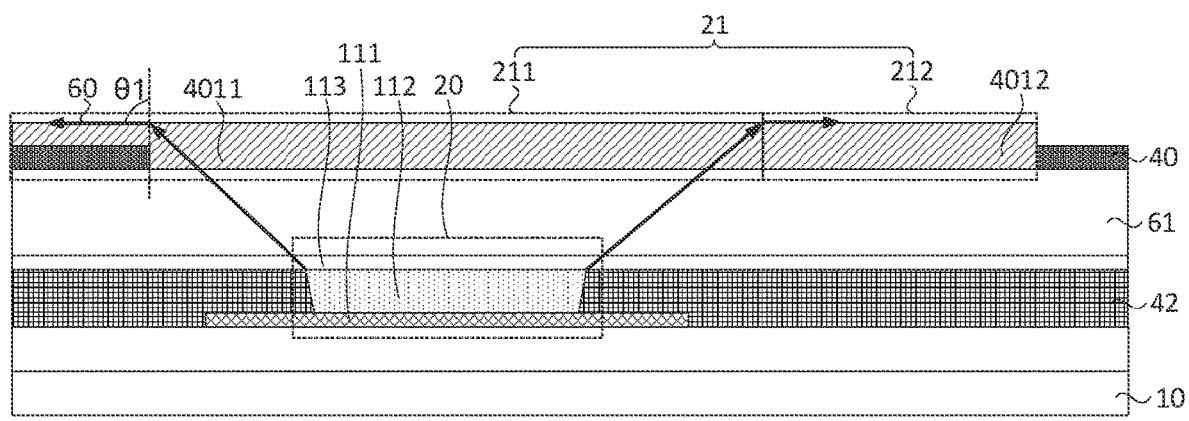
FIG. 12 is a sectional view taken along direction E-E' in FIG. 11.

FIG. 11 is a partial structural view of still another display panel according to an embodiment of the present disclosure. FIG. 12 is a sectional view taken along direction E-E' in FIG. 11. As shown in FIGS. 11 and 12, in an embodiment, the display panel provided by the embodiment of the present disclosure further includes a black matrix 40. The black matrix 40 is located on a side of the multiple color-resist blocks 12 near the multiple light-emitting units 11 and is disposed between two adjacent ones of the multiple color-resist blocks 12. The black matrix 40 includes a first opening 401. The first opening 401 includes a first sub-opening 4011 and a second sub-opening 4012. The first display color-resist block 211 covers the first sub-opening 4011. The first imaging color-resist block 212 covers the second sub-opening 4012. The first sub-opening 4011 is in communication with the second sub-opening 4012.

As shown in FIGS. 11 and 12, the black matrix 40 is provided with a first opening 401. The first opening 401 includes a first sub-opening 4011 and a second sub-opening 4012. The first sub-opening 4011 is used for allowing light emitted from the first light-emitting unit 20 to pass through for display. The second sub-opening 4012 is used for cooperating with the first imaging color-resist block 212 to form an optical path to satisfy the working requirements of the preset functional element through light from the outside environment. When the distance between the first sub-opening 4011 and the second sub-opening 4012 is very close, along a direction perpendicular to the plane where the substrate 10 is located, the first sub-opening 4011 may at least partially overlap with the second sub-opening 4012. In this embodiment, the first sub-opening 4011 is set to be in communication with the second sub-opening 4012, that is, the black matrix 40 is not provided between the first sub-opening 4011 and the second sub-opening 4012, to prevent the black matrix 40 between the first sub-opening 4011 and the second sub-opening 4012 from affecting the normal display of the first light-emitting unit 20. Meanwhile, the first sub-opening 4011 and the second sub-opening 4012 which are in communication can reduce the preparation accuracy of the mask when preparing the first opening 401, and there is no need to prepare a mask opening for the second sub-opening 4012 separately.

Figure 13:
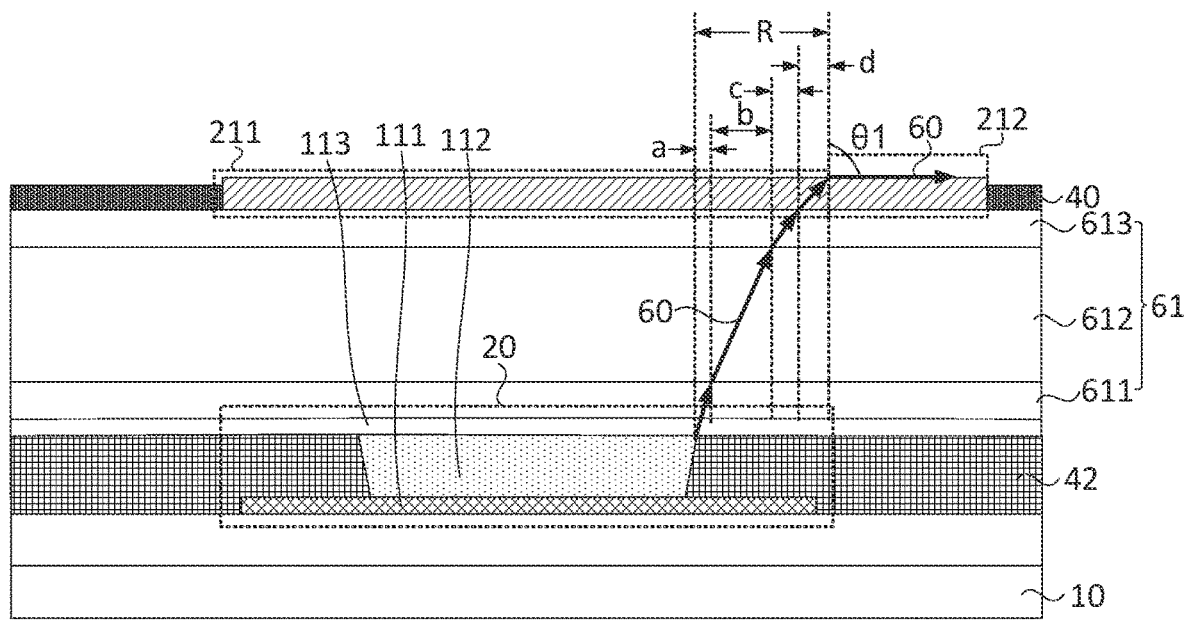
FIG. 13 is a partial sectional view of another display panel according to an embodiment of the present disclosure.

FIG. 13 is a partial sectional view of another display panel according to an embodiment of the present disclosure. As shown in FIG. 13, in an embodiment, the first light-emitting unit 20 emits a first color light. The exit light of the display panel includes a first exit light 60. The first exit light 60 is light generated after the first color light emitted from the first light-emitting unit 20 is outputted through the first display color-resist block 211. The first exit light 60 has a first viewing angle range, where the first viewing angle range is θ1, where θ1 is greater than or equal to 0° and less than or equal to 90°.

In an embodiment, as shown in FIGS. 12 and 13, the boundary position of the first light-emitting unit 20 on a side near the first imaging color-resist block 212 is set so that a boundary of the first light-emitting unit 20 on a side near the first imaging color-resist block 212 is sufficiently far from the first imaging color-resist block 212. Therefore, light in each viewing angle range from 0° to 90° is emitted by the first display color-resist block 211 so that no extra light is leaked from the first imaging color-resist block 212 and the light emitted from the first color-resist block 21 is not more than the light emitted from other color blocks of the same color, to improve the brightness uniformity of the display panel.

The boundary position of the first light-emitting unit 20 on a side near the first imaging color-resist block 212 may be calculated by the following formulas:

$$R=\Sigma_i d_i;$$

$$d_i=h_i*\tan(\theta_i);$$

$$n_i*san(\theta_i)=n_{i+1}*\sin(\theta_{i+1})=n_{air}*\sin(\text{view angle}); \text{ and}$$

$$n_i=n_i(\lambda).$$

In the above formulas, R represents the sum of the distances that a light ray travels in each film layer along the direction parallel to the plane where the substrate 10 is located, $d_i$ represents the propagation distance of a light ray in each film layer of the display panel along the direction parallel to the plane where the substrate 10 is located, $\theta_i$ represents the angle of incidence/refraction of a light ray in each film layer, $n_i$ represents the refractive index of each film layer, $n_{air}$ represents the refractive index of air, view angle represents the angle of a light ray emitted from the display panel, and λ represents the wavelength of a light ray.

With continued reference to FIG. 13, for example, an encapsulation layer 61 is disposed on a side of the first light-emitting unit 20 farther away from the substrate 10 to provide water-oxygen protection for the first light-emitting unit 20. The encapsulation layer 61 is a thin-film encapsulation layer, and the thin-film encapsulation layer may include a structure of three layers, that is, an inorganic layer, an organic layer, and an inorganic layer, which insulates water vapor and has the advantages of thinness and flexibility. In this embodiment, the encapsulation layer 61 includes a first inorganic layer 611, an organic layer 612, and a second inorganic layer 613. Since the refractive indexes $n_i$ of each film layer in the encapsulation layer 61 and the first color-resist block 21 are different from each other, the light emitted from the first light-emitting unit 20 is deflected when the light is emitted into the air. For example, as shown in FIG. 13, along the direction parallel to the plane where the substrate 10 is located, the light emitted from the first light-emitting unit 20 is deflected through the first inorganic layer 611 by a transverse distance a, then deflected through the organic layer 612 by a transverse distance b, deflected through the second inorganic layer 613 by a transverse distance c, deflected through the first color-resist block 21 by a transverse distance d, and finally emitted at an angle θ1. The transverse distance by which the light is deflected through each film layer may be calculated according to formulas $d_i = h_i * \tan(\theta_i)$ and $n_i * \sin(\theta_i) = n_{i+1} * \sin(\theta_{i+1}) = n_{air} * \sin(\text{view angle})$. The distance R by which the light of each viewing angle travels in each film layer along the direction parallel to the plane where the substrate 10 is located may be calculated by adding the deflected transverse distance in the each film layer. The backward derivation is performed according to the above-mentioned processes, that is, according to the thickness, refractive index, and exit angle θ1 of each film layer, the range where the first light-emitting unit 20 should be located may be obtained from the exit position of the light of each viewing angle.

For example, as shown in FIG. 13, in order to ensure that the light of each viewing angle range from 0° to 90° is emitted from the first display color-resist block 211, the light of a viewing angle of 10° may be set to be emitted just from the boundary of the first display color-resist block 211 (that is, view angle=θ1=90°). According to the refractive index and thickness of each film layer in the encapsulation layer 61 and the first display color-resist block 211, the distance R of the light of a viewing angle of 90° in the encapsulation layer 61 and the first display color-resist block 211 along the direction parallel to the plane where the substrate 10 is located may be obtained from the formulas $d_i = h_i * \tan(\theta_i)$, $n_i * \sin(\theta_i) = n_{i+1} * \sin(\theta_{i+1}) = n_{air} * \sin(\text{view angle})$, and $R = \Sigma_i d_i$, the position at which the light of a viewing angle of 90° is emitted from the first light-emitting unit 20 may be determined, and the boundary position of the first light-emitting unit 20 on a side near the first imaging color-resist block 212 may be further determined, so that light of a full field angle of 90° of the display panel is emitted through the first imaging color-resist block 211 and no extra light is emitted through the first imaging color-resist block 212, to ensure the brightness uniformity of the display panel.

Based on the above-mentioned principle, calculation of the boundary of the first light-emitting unit 20 on a side near the first imaging color-resist block 212 and the position of the first imaging color-resist block 212 according to actual requirements, as long as it is ensured that along the direction parallel to the plane where the substrate 10 is located, the distance between the boundary of the first imaging color-resist block 212 on a side near the first light-emitting unit 20 and the boundary of the first light-emitting unit 20 on a side near the first imaging color-resist block 212 is greater than or equal to R, that is, as long as it is ensured that the light of each viewing angle range of 0° to 90° is emitted from the first display color-resist block 211 and no extra light is leaked through the first imaging color-resist block 212, to ensure the brightness uniformity of the display panel.

With continued reference to FIG. 3, in an embodiment, the display panel provided by the embodiments of the present disclosure further includes a black matrix 40. The black matrix 40 is located on a side of the multiple color-resist blocks 12 near the multiple light-emitting units 11 and is disposed between two adjacent ones of the multiple color-resist blocks 12. The black matrix 40 includes a first opening 401. The first opening 401 includes a first sub-opening 4011 and a second sub-opening 4012. The first display color-resist block 211 covers the first sub-opening 4011. The first imaging color-resist block 212 covers the second sub-opening 4012. The first sub-opening 4011 is not in communication with the second sub-opening 4012.

As shown in FIG. 3, the black matrix 40 is provided with a first opening 401. The first opening 401 includes a first sub-opening 4011 and a second sub-opening 4012. The first sub-opening 4011 is used for allowing light emitted from the first light-emitting unit 20 to pass through for display. The second sub-opening 4012 is used for cooperating with the first imaging color-resist block 212 to form an optical path to satisfy the working requirements of the preset functional element through light from the outside environment. In this embodiment, according to the actual color-resist block layout requirements and the working parameters of the preset functional element, the distance between the first sub-opening 4011 and the second sub-opening 4012 may be relatively far and thus the first sub-opening 4011 and the second sub-opening 4012 are not in communication with each other, that is, a black matrix 40 is provided between the first sub-opening 4011 and the second sub-opening 4012 so that the exit angle of the light emitted from the first light-emitting unit 20 is limited by the black matrix 40, to improve the brightness uniformity of the display panel in the viewing angle range in all directions.

With continued reference to FIGS. 1 to 7, in an embodiment, along the direction parallel to the plane where the substrate 10 is located, the shortest distance between any point on an edge of the first light-emitting unit 20 and the black matrix 40 is equal.

In this embodiment, as shown in FIGS. 1 to 7, the shortest distance between any point on an edge of the first light-emitting unit 20 and the black matrix 40 is set to be equal along the direction parallel to the plane where the substrate 10 is located so that the viewing angle range of the light emitted from the first display color-resist block 211 is consistent with each other in all directions, to facilitate the improvement of the brightness uniformity of the display panel in the viewing angle range in all directions.

The shortest distance between any point on an edge of the first light-emitting unit 20 and the black matrix 40 may be set according to actual requirements for the display viewing angle range. For example, along the direction parallel to the plane where the substrate 10 is located, the shortest distance between any point on an edge of the first light-emitting unit 20 and the black matrix 40 may be set to 5 μm to 9 μm, which is not limited in the embodiments of the present disclosure.

With continued reference to FIGS. 4 and 6, in an embodiment, the vertical projection of the first sub-opening 4011 on the plane where the substrate 10 is located covers the vertical projection of the first light-emitting unit 20 on the plane where the substrate 10 is located, and the shape of the vertical projection of the first sub-opening 4011 on the plane where the substrate 10 is located is similar to the shape of the vertical projection of the first light-emitting unit 20 on the plane where the substrate 10 is located.

As shown in FIGS. 4 and 6, the shape of the vertical projection of the first sub-opening 4011 on the plane where the substrate 10 is located is set to be similar to the shape of the vertical projection of the first light-emitting unit 20 on the plane where the substrate 10 is located to set the shape of the first sub-opening 4011 according to the light-emitting range of the first light-emitting unit 20 and thus to reasonably limit the exit angle of the light emitted from the first light-emitting unit 20, to facilitate the consistency of the viewing angle range of the light emitted from the first display color-resist block 211 in all directions and improving the brightness uniformity of the display panel in the viewing angle range in all directions.

It is to be noted that the similar figures mentioned in the present application refer to two figures with equal corresponding angles and proportional corresponding edges, that is, if the two figures have the same shape but are not necessarily equal in size, then the two figures are similar to each other.

With continued reference FIG. 3, in an embodiment, the first light-emitting unit 20 emits a first color light. The first color light emitted by the first light-emitting unit 20 includes a first blocking light 62. The first blocking light 62 is light shielded by the black matrix 40 in the first color light emitted by the first light-emitting unit. The first blocking light 62 has a second viewing angle range, where the second viewing angle range is from θ2 to 90°, where 30°≤θ2≤60°.

As shown in FIG. 3, at a large viewing angle, the light emitted from the display panel has the attenuation phenomenon, and since the wavelength of light of different colors is different, the attenuation degree of the light of different colors is different, and the phenomenon of color cast easily occurs at a large viewing angle, which affects the display effect. For example, at a large viewing angle, the longer the wavelength of light, the greater the attenuation of the light, and therefore, the phenomenon of the color cast will occur at a large viewing angle. In this embodiment, the black matrix 40 is set to shield the first color light of a large viewing angle emitted from the first light-emitting unit 20 so that light of a viewing angle of theta θ2 to 90° cannot be emitted, to improve the color cast problem of the display panel at a large viewing angle and ensure the display effect of the display panel.

With continued reference to FIGS. 4 and 6, in an embodiment, the light-emitting unit 10 further includes a second light-emitting unit 22. The emitted color of the second light-emitting unit 22 is the same as the emitted color of the first light-emitting unit 20. Along the direction parallel to the plane where the substrate 10 is located, the shortest distance between any point on an edge of the second light-emitting unit 22 and the black matrix 40 is equal, and the shortest distance between any point on the edge of the second light-emitting unit 22 and the black matrix 40 is equal to the shortest distance between any point on the edge of the first light-emitting unit 20 and the black matrix 40.

As shown in FIGS. 4 and 6, along the direction parallel to the plane where the substrate 10 is located, the shortest distance between any point on an edge of the first light-emitting unit 20 and the black matrix 40 is set to be equal, the shortest distance between any point on an edge of the second light-emitting unit 22 and the black matrix 40 is set to be equal, and the shortest distance between any point on an edge of the second light-emitting unit 22 and the black matrix 40 is set to be equal to the shortest distance between any point on an edge of the first light-emitting unit 20 and the black matrix 40, so that the viewing angle range of the light emitted from the first display color-resist block 211 is consistent with the viewing angle range of the light emitted from the second color-resist block 23 in all directions, to facilitate the improvement of the brightness uniformity of the display panel in the viewing angle ranges in all directions.

In an embodiment, the first imaging color-resist block 212 is each a color-resist block of the same color.

In general, since the wavelength of working light required by the preset functional element is concentrated in the wavelength range of a color light, the first imaging color-resist block 212 is each set as the color-resist of the same color, which can ensure that all light passing through the optical path is the light required by the preset functional element.

With continued reference to FIG. 3, in an embodiment, the color of the first display color-resist block 211 is the same as the color of the first imaging color-resist block 212.

As shown in FIG. 3, the color of the first display color-resist block 211 is set to be the same as the color of the first imaging color-resist block 212 so that the first display color-resist block 211 and the first imaging color-resist block 212 can be prepared in the same process, to simplify the preparation process of the first imaging color-resist block 212.

In an embodiment, the first color-resist block 21 includes a green color-resist block.

In general, the best wavelength range of the working light of most preset functional elements is also in the wavelength range of green light, that is, the preset functional element has a strong light collection ability for the green light, and the sensitivity of the preset functional element in the green light working state is high. In this embodiment, the first color-resist block 21 is set to include a green color-resist block, which can improve the operating sensitivity of the preset functional element, and when the preset functional element is a fingerprint identification element, the fingerprint identification sensitivity of the display panel can be improved.

In other embodiments, the first color-resist block 21 may also include a red color-resist block or a blue color-resist block, or the first color-resist block 21 may also include any two of a red color-resist block, a green color-resist block, and a blue color-resist block, or even the first color-resist block 21 may include all of a red color-resist block, a green color-resist block, and a blue color-resist block, which can be set according to the actual requirements and is not limited in the embodiments of the present disclosure.

Figure 14:
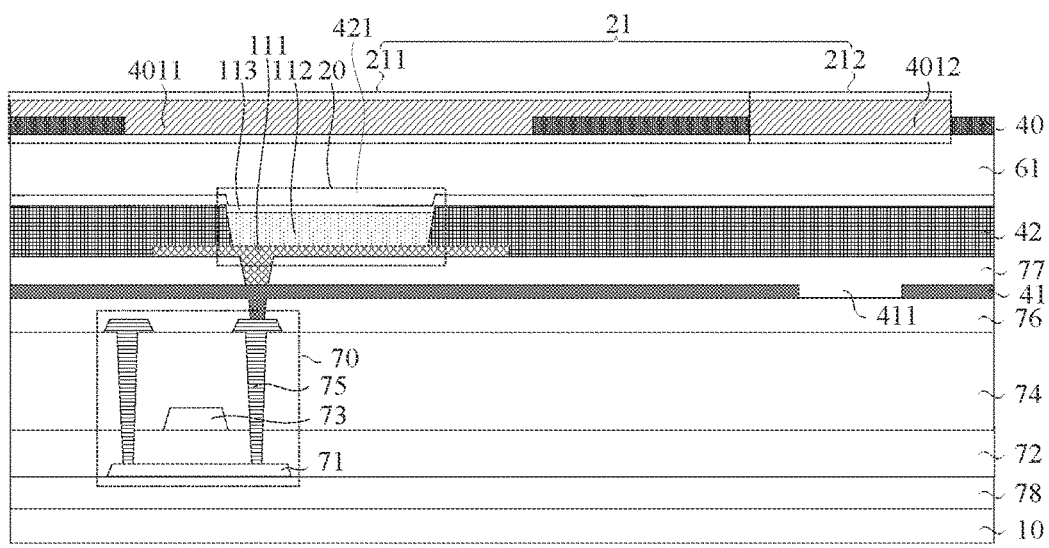
FIG. 14 is a partial sectional view of still another display panel according to an embodiment of the present disclosure.

FIG. 14 is a partial sectional view of still another display panel according to an embodiment of the present disclosure. As shown in FIGS. 1 and 14, in an embodiment, the display panel provided by the embodiment of the present disclosure further includes a black matrix 40. The black matrix 40 is located on a side of the multiple color-resist blocks 12 near the multiple light-emitting units 11 and is disposed between two adjacent ones of the multiple color-resist blocks 12. The black matrix includes a first opening 401. The first opening 401 includes a first sub-opening 4011 and a second sub-opening 4012. The first display color-resist block 211 covers the first sub-opening 4011. The first imaging color-resist block 212 covers the second sub-opening 4012. The display panel further includes a light shielding layer 41. The light shielding layer 41 is disposed on a side of the multiple light-emitting units 11 near the substrate 10. The light shielding layer 41 includes a third opening 411. The vertical projection of the second sub-opening 4012 on the plane where the substrate 10 is located covers the vertical projection of the third opening 411 on the plane where the substrate 10 is located.

As shown in FIGS. 1 and 14, the black matrix 40 is provided with a first opening 401. The first opening 401 includes a first sub-opening 4011 and a second sub-opening 4012. The first sub-opening 4011 is used for allowing light emitted by the first light-emitting unit 20 to pass through for display. The second sub-opening 4012 is used for cooperating with the first imaging color-resist block 212 to form an optical path to satisfy the working requirements of the preset functional element through light from the outside environment. The display panel further includes a light shielding layer 41. The light shielding layer 41 is disposed on a side of the multiple light-emitting units 11 near the substrate 10. The light shielding layer 41 includes a third opening 411. In an embodiment, the vertical projection of the third opening 411 on the plane where the substrate 10 is located at least partially overlaps with the vertical projection of the second sub-opening 4012 on the plane where the substrate 10 is located. The third opening 411 and the second sub-opening 4012 form an optical path to satisfy the requirements of the preset functional element for working light.

With continued reference to FIGS. 1 and 14, in an embodiment, the vertical projection of the second sub-opening 4012 on the plane where the substrate 10 is located covers the vertical projection of the third opening 411 on the plane where the substrate 10 is located, and the area of the vertical projection of the third opening 411 on the plane where the substrate 10 is located is less than or equal to the area of the vertical projection of the second sub-opening 4012 on the plane where the substrate 10 is located. The third opening 411 and the second sub-opening 4012 form an optical path to improve the light collection of the preset functional element and improve the working sensitivity of the preset functional element.

With continued reference to FIGS. 1 and 14, for example, in a case of an OLED display panel, the display panel provided by the embodiment of the present disclosure further includes a pixel circuit layer located on a side of the substrate 10. The pixel circuit layer is provided with a thin-film transistor 70. The thin-film transistor 70 includes an active layer 71, a gate layer 73, and a source drain layer 75 which are laminated on a side of the substrate 10. The light shielding layer 41 may be a metal layer separately disposed between the light-emitting unit 11 and the source drain layer 75 so that the light shielding layer 41 may transmit light only at the third opening 411, which facilitates the reduction of the influence of stray light from the outside environment on the preset functional element, to improve the working sensitivity of the preset functional element.

With continued reference to FIG. 14, in an embodiment, the light shielding layer 41 may also have the function of parallel wiring. For example, as shown in FIG. 14, the light shielding layer 41 is disposed in parallel with the source drain layer 75 to reduce impedance, to reduce attenuation of signals transmitted on the source drain layer 75 and facilitating the improvement of the display effect of the display panel. Meanwhile, the source drain layer 75 may be electrically connected with the anode layer 111 through the light shielding layer 41 to avoid deep drilling, to reduce the process difficulty of electrical connection between the source drain layer 75 and the anode layer 111.

In other embodiments, the light shielding layer 41 may be disposed in the same layer as the anode layer 111 as well as the gate layer 73 and the source drain layer 75 of the thin-film transistor 70 and formed by the same patterning process of metal layers to reduce the thickness of the display panel and reduce the process, which is not limited in the embodiments of the present disclosure and depends on the actual situation.

With continued reference to FIG. 14, in an embodiment, the display panel provided by the embodiment of the present disclosure further includes a pixel defining layer 42. The pixel defining layer 42 includes a fourth opening 421. The vertical projection of the first light-emitting unit 20 on the plane where the substrate 10 is located coincides with the vertical projection of the fourth opening 421 on the plane where the substrate 10 is located. The vertical projection of the pixel defining layer 42 on the plane where the substrate 10 is located covers the vertical projection of the third opening 411 on the plane where the substrate 10 is located.

As shown in FIG. 14, the first light-emitting unit 20 is disposed in the fourth opening 421 of the pixel defining layer 42, and the pixel defining layer 42 is used for defining the effective light-emitting region of the first light-emitting unit 20. In this embodiment, the vertical projection of the pixel defining layer 42 on the plane where the substrate 10 is located is set to cover the vertical projection of the third opening 411 on the plane where the substrate 10 is located so that the third opening 411 does not overlap with the fourth opening 421 along the direction perpendicular to the plane where the substrate 10 is located, that is, along the direction perpendicular to the plane where the substrate 10 is located, the third opening 411 does not overlap with the first light-emitting unit 20, to reduce the influence of light emitted from the first light-emitting unit 20 on the preset functional element and improving the working sensitivity of the preset functional element.

It is to be noted that the distance between the third opening 411 and the fourth opening 421 may be set according to actual requirements. For example, along the direction parallel to the plane where the substrate 10 is located, the distance between a boundary of the third opening 411 on a side near the fourth opening 421 and a boundary of the fourth opening 421 on a side near the third opening 411 ranges from 6 μm to 7 μm, to reduce the influence of the light emitted from the first light-emitting unit 20 on the preset functional element and ensure the compactness of the structure, which is not limited in the embodiments of the present disclosure.

With continued reference to FIG. 14, it is to be noted that the range of the second sub-opening 4012 may be calculated according to the range of expansion of the third opening 411, where the opening area of the second sub-opening 4012 may depend on the opening area of the third opening 411 and the film layer design between the second sub-opening 4012 and the light shielding layer 41. In general, the opening area of the second sub-opening 4012 is proportional to the thickness of a film layer between the second sub-opening 4012 and the light shielding layer 41, that is, the smaller the thickness of the film layer, the smaller the opening area of the second sub-opening 4012.

For example, along the direction perpendicular to the plane where the substrate 10 is located, the center of the second sub-opening 4012 coincides with the center of the third opening 411, and compared with the range of the third opening 411, the range of the second sub-opening 4012 is uniformly expanded by a value which may be determined by the limit signal amount required by the preset functional element under the laminated film layer structure, so that the second sub-opening 4012 does not block the optical path of the light collected by the preset functional element. Meanwhile, when the area of the second sub-opening 4012 is too large, the luminous flux of the collected light is not increased, but the reflectance of the metal layer below the second sub-opening 4012 will be increased. Therefore, in an embodiment, the range of the second sub-opening 4012 can be set to a critical value that does not block the optical path of the light collected by the preset functional element, which is not limited in the embodiments of the present disclosure.

In an embodiment, after the range of the second sub-opening 4012 is determined according to the range of the third opening 411, the range of the fourth opening 421 is calculated according to the range of the second sub-opening 4012 so that the light of a large viewing angle emitted from the first light-emitting unit 20 is not leaked through the second sub-opening 4012. Therefore, the light emitted from the first color-resist block 21 is not more than the light emitted from other color-resist blocks of the same color so that the display brightness of the first color-resist block 21 is not visually significantly different from the display brightness of other color-resist blocks, to improve the brightness uniformity of the display panel.

In other embodiments, other functional film layers of the display panel may be set according to actual requirements, which is not limited in the embodiments of the present disclosure.

For example, with continued reference to FIG. 14, the display panel further includes a gate insulating layer 72, an interlayer dielectric layer 74, a passivation layer 76, and a planarization layer 77 which are laminated. Any one or more of the above-mentioned insulating layers may be set according to actual requirements, which is not limited in the embodiments of the present disclosure.

With continued reference to FIG. 14, in an embodiment, a buffer layer 78 is also disposed on a side of the substrate 10 near the first light-emitting unit 20 and can function as a layer for shake prevention, buffer, and isolation.

Figure 18:
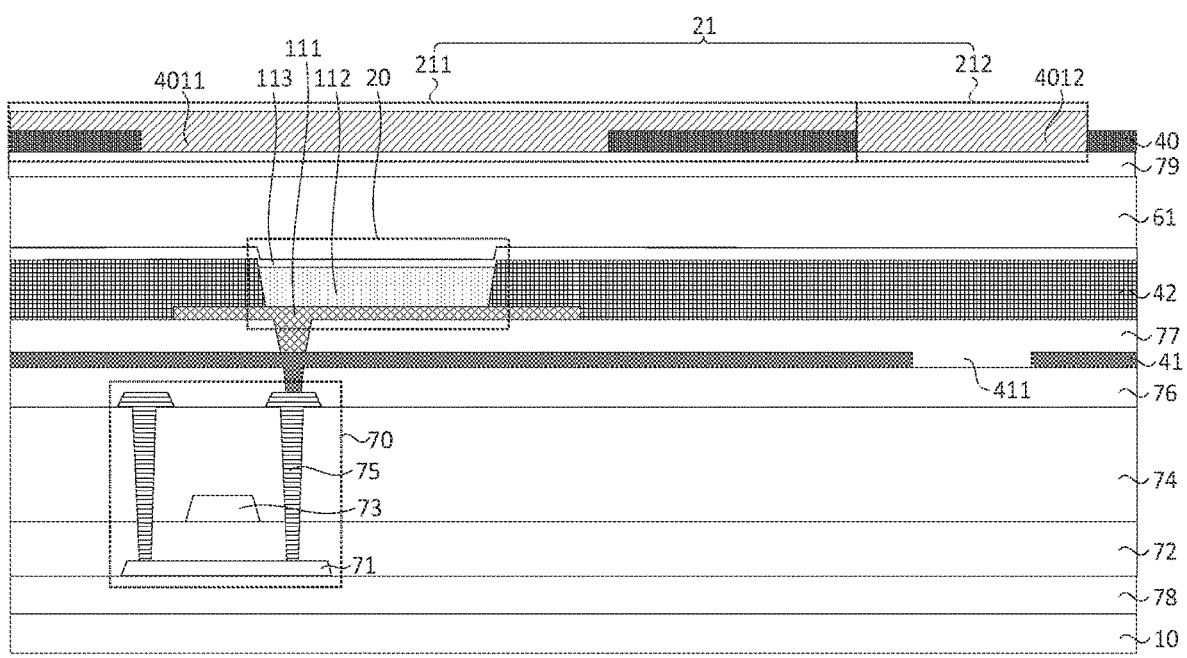
FIG. 18 is a partial sectional view of yet another display panel according to an embodiment of the present disclosure.

FIG. 18 is a partial sectional view of yet another display panel according to an embodiment of the present disclosure. As shown in FIG. 18, in an embodiment, the display panel provided by the embodiment of the present disclosure further includes a touch electrode layer 79 to realize the touch control function of the display panel. As shown in FIG. 18, the touch electrode layer 79 may be located on a side of the encapsulation layer 61 near the black matrix 40, and in other embodiments, the touch electrode layer 79 may also be located on a side of the multiple color-resist blocks 12 farther away from the substrate 10, which is not limited in the embodiments of the present disclosure.

Figure 15:
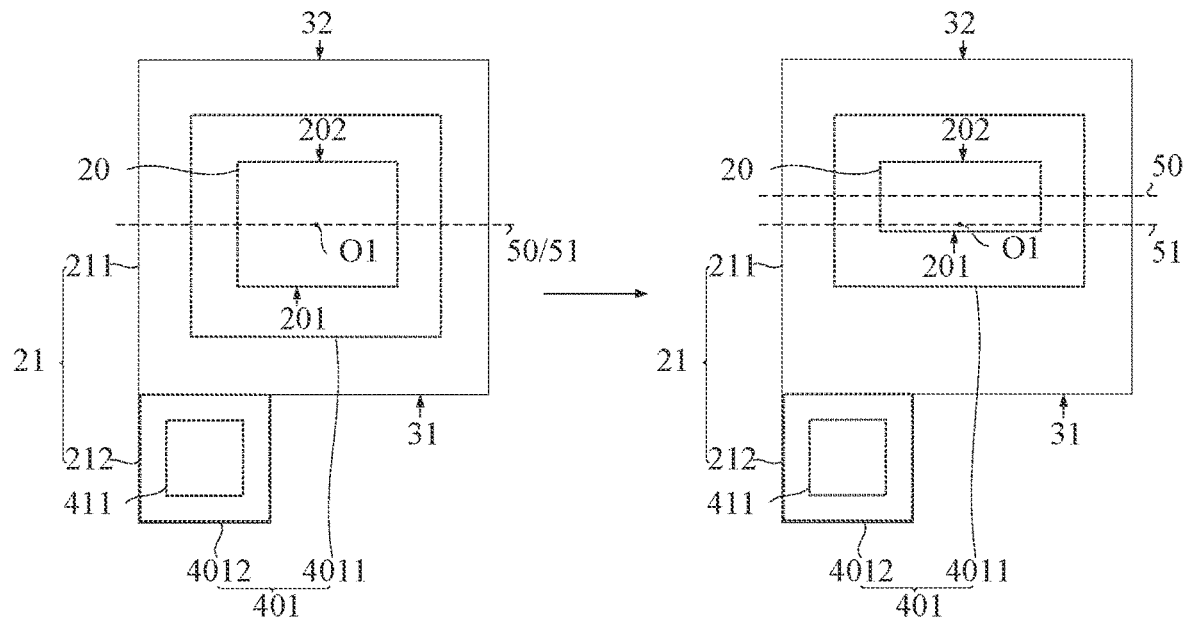
FIG. 15 is a flowchart of a design method of a display panel according to an embodiment of the present disclosure.

FIG. 15 is a flowchart of a design method of a display panel according to an embodiment of the present disclosure. As shown in FIG. 15, the first light-emitting unit 20 and the first color-resist block 21 shown on the left side are the design schemes in the related art, and the first light-emitting unit 20 and the first color-resist block 21 on the right side are the design schemes provided by the embodiment of the present disclosure. Based on the range of the first imaging color-resist block 212 in the related art, the first boundary 201 of the first light-emitting unit 20 near the first imaging color-resist block 212 is moved to a side farther away from the first imaging color-resist block 212 so that the first symmetry axis 50 of the first light-emitting unit 20 is located on a side of the first central axis 51 of the first display color-resist block 211 farther away from the first imaging color-resist block 212. Therefore, the distance between the first light-emitting unit 20 and the first imaging color-resist block 212 is relatively far, and the light emitted from the first light-emitting unit 20 is not easily leaked through the first imaging color-resist block 212, to reduce the light of a large viewing angle leaked through the first imaging color-resist block 212, to improve the brightness uniformity of the display panel.

With continued reference to FIG. 15, in an embodiment, the first sub-opening 4011 of the black matrix 40 is also moved following the boundary of the first light-emitting unit 20 so that the viewing angle range of the light emitted from the first display color-resist block 211 is consistent with each other in all directions, to improve the brightness uniformity of the display panel in the viewing angle range in all directions.

In this embodiment, the effective light-emitting area of the first light-emitting unit 20 is reduced, and the brightness of the first light-emitting unit 20 is increased by increasing the drive current of the first light-emitting unit 20, to compensate for the brightness attenuation caused by the reduction of the effective light-emitting area of the first light-emitting unit 20.

Figure 16:
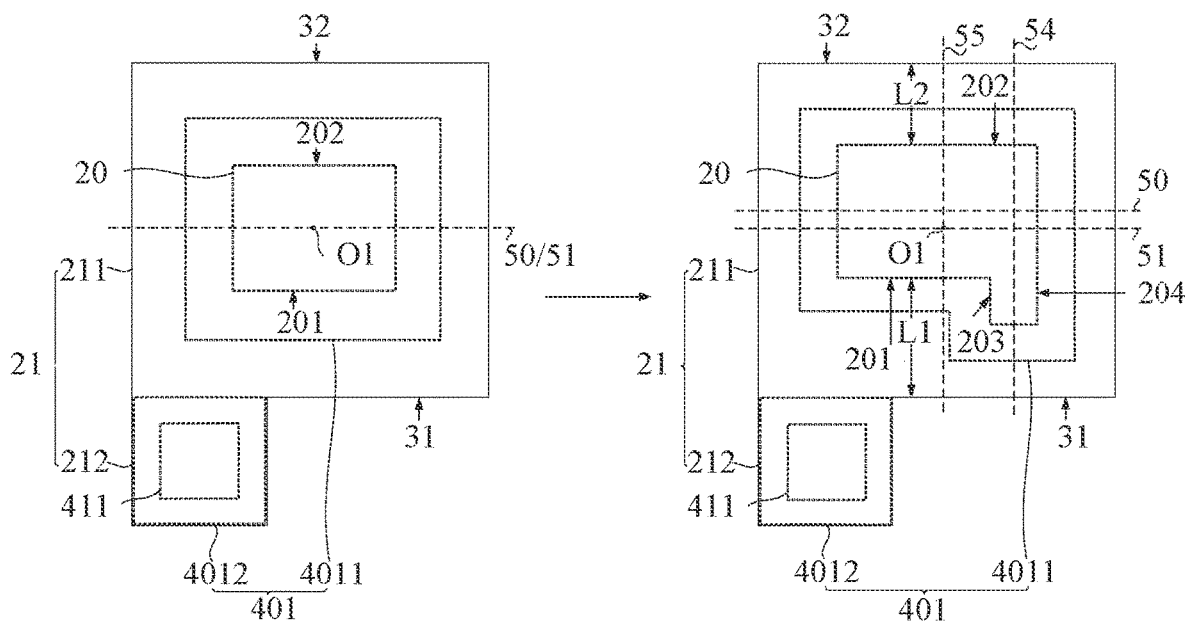
FIG. 16 is a flowchart of a design method of another display panel according to an embodiment of the present disclosure.

FIG. 16 is a flowchart of a design method of another display panel according to an embodiment of the present disclosure. As shown in FIG. 16, the first light-emitting unit 20 and the first color-resist block 21 shown on the left side are the design schemes in the related art, and the first light-emitting unit 20 and the first color-resist block 21 on the right side are the design schemes provided by the embodiment of the present disclosure. Based on the range of the first imaging color-resist block 212 in the related art, the first boundary 201 and the third boundary 203 of the first light-emitting unit 20 near the first imaging color-resist block 212 are moved to a side farther away from the first imaging color-resist block 212, and the third boundary 203 intersects with the first boundary 201, so that the first symmetry axis 50 of the first light-emitting unit 20 is located on a side of the first central axis 51 of the first display color-resist block 211 farther away from the first imaging color-resist block 212 and the third symmetry axis 54 of the first light-emitting unit 20 is located on a side of the third central axis 55 of the first display color-resist block 211 farther away from the first imaging color-resist block 212. Therefore, the distance between the first light-emitting unit 20 and the first imaging color-resist block 212 is relatively far, and the light emitted from the first light-emitting unit 20 is not easily leaked through the first imaging color-resist block 212, to reduce the light of a large viewing angle leaked through the first imaging color-resist block 212, to improve the brightness uniformity of the display panel.

With continued with reference to FIG. 16, in this embodiment, the first light-emitting unit 20 of an irregular shape is designed according to boundaries corresponding to the region where the first imaging color-resist block 212 is located, to maximize the light-emitting area of the first light-emitting unit 20. In an embodiment, along the direction parallel to the plane where the substrate 10 is located, the shape of a boundary of the first light-emitting unit 20 on a side near the first imaging color-resist block 212 is complementary to the shape of a boundary of the first imaging color-resist block 212 on a side near the first light-emitting unit 20 so that the shape of the boundary of the first light-emitting unit 20 on the side near the first imaging color-resist block 212 fits with the shape of the boundary of the first imaging color-resist block 212 on the side near the first light-emitting unit 20, to make full use of the space of the display panel and increase the effective light-emitting area of the first light-emitting unit 20, to facilitate the improvement of the luminescence efficiency of the first light-emitting unit 20 and ensuring a good display effect of the display panel.

With continued reference to FIG. 16, in an embodiment, the first sub-opening 4011 of the black matrix 40 is also moved following the boundaries of the first light-emitting unit 20 so that the viewing angle range of the light emitted from the first display color-resist block 211 is consistent with each other in all directions, to improve the brightness uniformity of the display panel in the viewing angle range in all directions.

In this embodiment, part of the effective light-emitting area of the first light-emitting unit 20 is reduced, and the brightness of the first light-emitting unit 20 is increased by increasing the drive current of the first light-emitting unit 20, to compensate for the brightness attenuation caused by the reduction of the effective light-emitting area of the first light-emitting unit 20.

Figure 17:
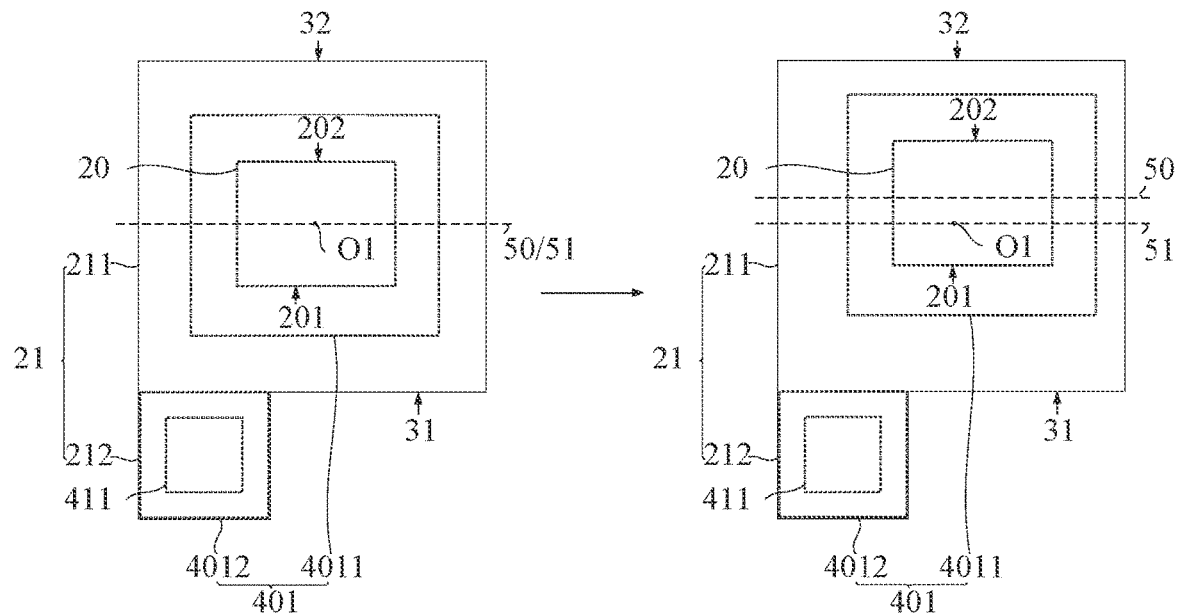
FIG. 17 is a flowchart of a design method of still another display panel according to an embodiment of the present disclosure.

FIG. 17 is a flowchart of a design method of still another display panel according to an embodiment of the present disclosure. As shown in FIG. 17, the first light-emitting unit 20 and the first color-resist block 21 shown on the left side are the design schemes in the related art, and the first light-emitting unit 20 and the first color-resist block 21 on the right side are the design schemes provided by the embodiment of the present disclosure. Based on the range of the first imaging color-resist block 212 in the related art, the entire first light-emitting unit 20 is moved to a side farther away from the first imaging color-resist block 212 so that the first symmetry axis 50 of the first light-emitting unit 20 is located on a side of the first central axis 51 of the first display color-resist block 211 farther away from the first imaging color-resist block 212. Therefore, the distance between the first light-emitting unit 20 and the first imaging color-resist block 212 is relatively far, and the light emitted from the first light-emitting unit 20 is not easily leaked through the first imaging color-resist block 212, to reduce the light of a large viewing angle leaked through the first imaging color-resist block 212, to improve the brightness uniformity of the display panel.

With continued reference to FIG. 17, in an embodiment, the first sub-opening 4011 of the black matrix 40 is also moved following the first light-emitting unit 20 so that the viewing angle range of the light emitted from the first display color-resist block 211 is consistent with each other in all directions, to improve the brightness uniformity of the display panel in the viewing angle range in all directions.

In this embodiment, the effective light-emitting area of the first light-emitting unit 20 is not changed so that the brightness of the first light-emitting unit 20 is not reduced and there is no need to compensate for the brightness of the first light-emitting unit 20.

Figure 19:
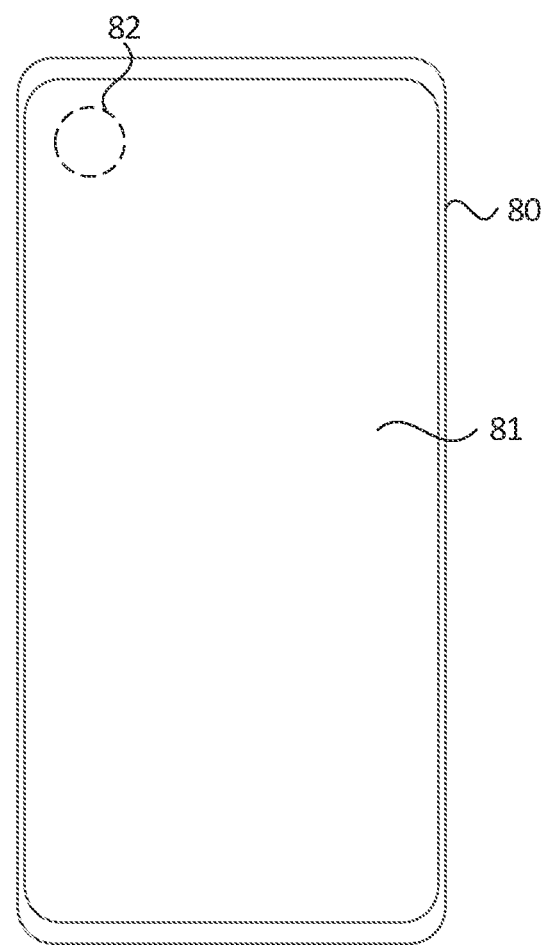
FIG. 19 is a structural view of a display device according to an embodiment of the present disclosure.

Based on the same concept, an embodiment of the present disclosure further provides a display device. FIG. 19 is a structural view of a display device according to an embodiment of the present disclosure. As shown in FIG. 19, the display device 80 includes the display panel 81 described in any embodiment of the present disclosure. Therefore, the display device 80 provided by the embodiment of the present disclosure described in any one of the above-mentioned embodiments, and structures which are the same as or correspond to structures in the above-mentioned embodiments and the explanation of the terms will not be repeated herein. The display device 80 provided by the embodiment of the present disclosure may be the phone shown in FIG. 19 or may be any electronic product having a display function, including but not limited to: televisions, laptops, desktop displays, tablet computers, digital cameras, smart bracelets, smart glasses, in-vehicle displays, medical displays, industrial control equipment, touch interactive terminals, etc., which is not limited in the embodiments of the present disclosure.

The display device further includes a preset functional element. The region shown by the dashed cycle 8 in FIG. 19 is a feasible set position of the preset functional element. The preset functional element includes, but is not limited to, a camera, a photosensitive element, a fingerprint identification module, a structured light emission module, and the like.

Figure 20:
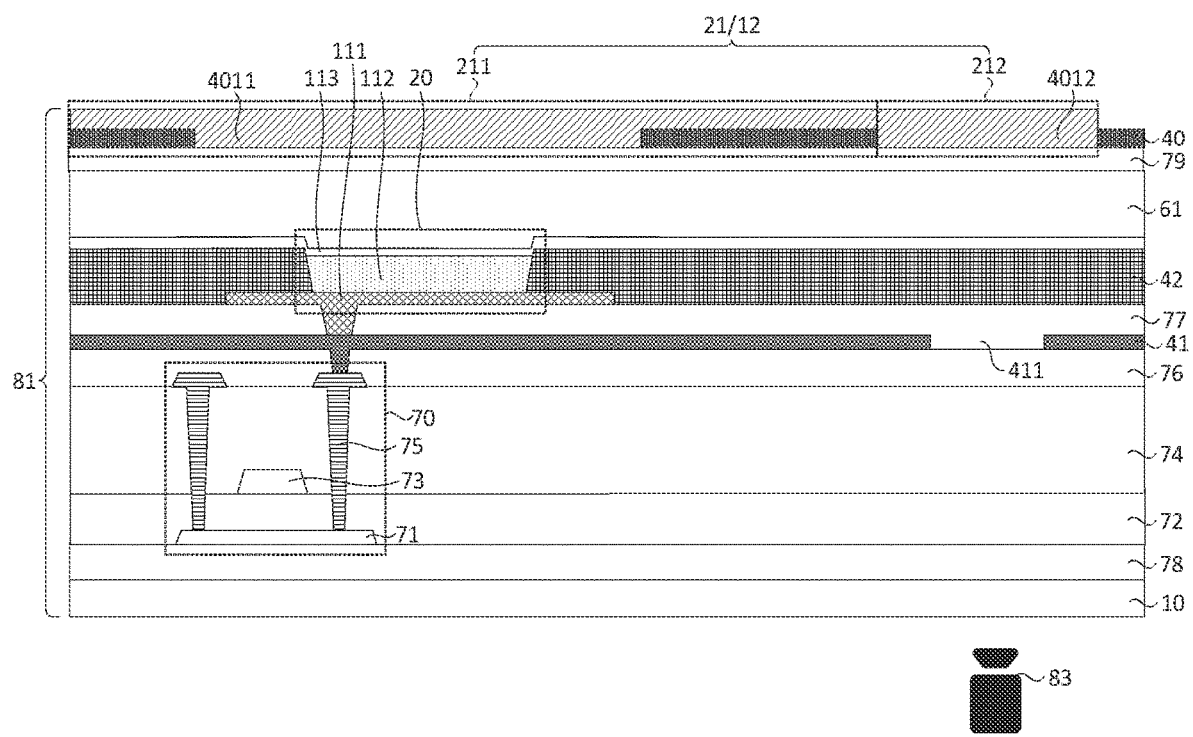
FIG. 20 is a partial sectional view of a display device according to an embodiment of the present disclosure.

FIG. 20 is a partial sectional view of a display device according to an embodiment of the present disclosure. As shown in FIG. 20, in an embodiment, the preset functional element 83 is located on a side of the light shielding layer 41 of the display panel 81 facing farther away from the multiple color-resist blocks 12 of the display panel 81. The light shielding layer 41 includes a third opening 411. The first imaging color-resist block 212 of the display panel 81 cooperates with the third opening 411 to form an optical path.

As shown in FIG. 20, the first imaging color-resist block 212 of the display panel 81 cooperates with the third opening 411 corresponding to the first imaging color-resist block 212 to form an optical path for allowing light from the outside environment to pass through, to satisfy the working requirements of preset functional element.

It is to be noted that for the sake of illustrative clarity, only one first imaging color-resist block 212 and one third opening 411 are shown in FIG. 20, and the first imaging color-resist block 212 and the third opening 411 are in one-to-one correspondence. In the practical application, there is generally the first imaging color-resist blocks 212 and the third openings 411 on the entire display panel 81.

In addition, FIG. 20 shows the arrangement mode of an out-cell preset functional element 83. In one embodiment of the present application, the preset functional element 83 may also be integrated inside the display panel, that is, the preset functional element 83 is located between the substrate 10 and the light shielding layer 41. The arrangement mode of the preset functional element 83 is not limited in the present application and depends on the actual situation.

What is claimed is:
1. A display panel, comprising:
   a substrate;
   a plurality of light-emitting units located on a side of the substrate; and
   a plurality of color-resist blocks sequentially located on a side of the plurality of light-emitting units facing away from the substrate; wherein
   each light-emitting unit comprise a first light-emitting unit, each color-resist block comprises a first color-resist block, and the first color-resist block and the first light-emitting unit are correspondingly disposed;
   the first color-resist block comprises a first display color-resist block and a first imaging color-resist block, wherein a vertical projection of the first display color-resist block on a plane where the substrate is located covers a vertical projection of the first light-emitting unit on the plane where the substrate is located;
   the first light-emitting unit comprises a first boundary and a second boundary disposed opposite to each other, wherein along a direction parallel to the plane where the substrate is located, the first boundary is located on a side of the second boundary near the first imaging color-resist block;

the first display color-resist block comprises a first edge and a second edge disposed opposite to each other, wherein along the direction parallel to the plane where the substrate is located, the first edge is located on a side of the second edge near the first imaging color-resist block; and along the direction parallel to the plane where the substrate is located, a maximum distance between the first boundary and the first edge is greater than a maximum distance between the second boundary and the second edge.

2. The display panel of claim 1, wherein
along the direction parallel to the plane where the substrate is located, a first symmetry axis of the first light-emitting unit is located on a side of a first central axis of the first display color-resist block farther away from the first imaging color-resist block; and
a shortest distance from a point on the first boundary to the first symmetry axis is equal to a shortest distance from a point on the second boundary to the first symmetry axis, and the first central axis passes through a center point of the first display color-resist block and is parallel to the first symmetry axis.

3. The display panel of claim 2, wherein
each light-emitting unit further comprise a second light-emitting unit, wherein the second light-emitting unit and the first light-emitting unit are configured to emit light in a same color; each color-resist block further comprises a second color-resist block, wherein the second color-resist block is disposed correspondingly to the second light-emitting unit, and a vertical projection of the second color-resist block on the plane where the substrate is located covers a vertical projection of the second light-emitting unit on the plane where the substrate is located; the second light-emitting unit comprises a third boundary and a fourth boundary disposed opposite to each other;
the second color-resist block comprises a third edge and a fourth edge disposed opposite to each other, wherein along the direction parallel to the plane where the substrate is located, the third edge is located on a side of the third boundary farther away from the fourth boundary, and the fourth edge is located on a side of the fourth boundary farther away from the third boundary;
along the direction parallel to the plane where the substrate is located, a maximum distance between the third boundary and the third edge is greater than a maximum distance between the fourth boundary and the fourth edge;
along the direction parallel to the plane where the substrate is located, a second symmetry axis of the second light-emitting unit is located on a side of a second central axis of the second color-resist block near the fourth boundary; and
a shortest distance from a point on the third boundary to the second symmetry axis is equal to a shortest distance from a point on the fourth boundary to the second symmetry axis, and the second central axis passes through a center point of the second color-resist block and is parallel to the second symmetry axis.

4. The display panel of claim 2, wherein
the first light-emitting unit further comprises a fifth boundary and a sixth boundary disposed opposite to each other, wherein along the direction parallel to the plane where the substrate is located, the fifth boundary is located on a side of the sixth boundary near the first imaging color-resist block; the fifth boundary intersects with the first boundary, and the sixth boundary intersects with the second boundary;

along the direction parallel to the plane where the substrate is located, a third symmetry axis of the first light-emitting unit is located on a side of a third central axis of the first display color-resist block farther away from the first imaging color-resist block;

a shortest distance from a point on the fifth boundary to the third symmetry axis is equal to a shortest distance from a point on the sixth boundary to the third symmetry axis, and the third central axis passes through the center point of the first display color-resist block and is parallel to the third symmetry axis;

a shortest distance between the first boundary and the first imaging color-resist block along a first direction is D1, a shortest distance between the fifth boundary and the first imaging color-resist block along a second direction is D2, D1=D2, and the first direction is parallel to the third symmetry axis, and the second direction is parallel to the first symmetry axis; and along the direction parallel to the plane where the substrate is located, a shape of a boundary of the first light-emitting unit on a side near the first imaging color-resist block is complementary to a shape of a boundary of the first imaging color-resist block on a side near the first light-emitting unit.

5. The display panel of claim 4, wherein
each light-emitting unit further comprises a second light-emitting unit, wherein the second light-emitting unit and the first light-emitting unit are configured to emit light in a same color; each color-resist block further comprises a second color-resist block, wherein the second color-resist block is disposed correspondingly to the second light-emitting unit, and a vertical projection of the second color-resist block on the plane where the substrate is located covers a vertical projection of the second light-emitting unit on the plane where the substrate is located; the second light-emitting unit comprises a third boundary and a fourth boundary disposed opposite to each other;
along the direction parallel to the plane where the substrate is located, a second symmetry axis of the second light-emitting unit is located on a side of a second central axis of the second color-resist block near the fourth boundary;
the second light-emitting unit further comprises a seventh boundary and an eighth boundary disposed opposite to each other, wherein along the direction parallel to the plane where the substrate is located, the seventh boundary intersects with the third boundary, and the eighth boundary intersects with the fourth boundary; and
along the direction parallel to the plane where the substrate is located, a fourth symmetry axis of the second light-emitting unit is located on a side of a fourth central axis of the second color-resist block near the eighth boundary;
wherein a shortest distance from a point on the third boundary to the second symmetry axis is equal to a shortest distance from a point on the fourth boundary to the second symmetry axis, and the second central axis passes through the center point of the second color-resist block and is parallel to the second symmetry axis;
a shortest distance from a point on the seventh boundary to the fourth symmetry axis is equal to a shortest distance from a point on the eighth boundary to the fourth symmetry axis, and the fourth central axis passes through the center point of the second color-resist block and is parallel to the fourth symmetry axis.

6. The display panel of claim 3, wherein an area of the first light-emitting unit is equal to an area of the second light-emitting unit.

7. The display panel of claim 3, wherein an area of the first display color-resist block is equal to an area of the second color-resist block.

8. The display panel of claim 3, wherein
the display panel further comprises a black matrix, wherein the black matrix is located on a side of the plurality of color-resist blocks near the plurality of light-emitting units and is disposed between two adjacent color-resist blocks;
the black matrix comprises a first opening and a second opening, wherein the first opening comprises a first sub-opening and a second sub-opening, the first display color-resist block covers the first sub-opening, the first imaging color-resist block covers the second sub-opening, and the second color-resist block covers the second opening; and
an area of the first sub-opening is equal to an area of the second opening.

9. The display panel of claim 8, wherein at least two of the second sub-openings have different shapes.

10. The display panel of claim 8, wherein each light-emitting unit further comprises a third light-emitting unit, each color-resist block comprises a third color-resist block, and the third color-resist block and the third light-emitting unit are correspondingly disposed;
a color of the third color-resist block is different from a color of the first color-resist block; and
a vertical projection of the second sub-opening on the substrate at least partially overlaps with a vertical projection of the third light-emitting unit adjacent to the second sub-opening on the substrate.

11. The display panel of claim 1, wherein
the display panel further comprises a black matrix, wherein the black matrix is located on a side of the plurality of color-resist blocks near the plurality of light-emitting units and is disposed between two adjacent color-resist blocks;
the black matrix comprises a first opening, wherein the first opening comprises a first sub-opening and a second sub-opening, the first display color-resist block covers the first sub-opening, and the first imaging color-resist block covers the second sub-opening;
the first sub-opening is in communication with the second sub-opening; the first light-emitting unit emits a first color light, an exit light of the display panel comprises a first exit light, and the first exit light is generated by the first color light emitted from the first light-emitting unit being exited through the first display color-resist block; and
the first exit light has a first viewing angle range, wherein the first viewing angle range is $\theta 1$, and $0°\leq\theta 1\leq 90°$.

12. The display panel of claim 1, wherein
the display panel further comprises a black matrix, wherein the black matrix is located on a side of the plurality of color-resist blocks near the plurality of light-emitting units and is disposed between two adjacent color-resist blocks;
the black matrix comprises a first opening, wherein the first opening comprises a first sub-opening and a second sub-opening, the first display color-resist block covers the first sub-opening, and the first imaging color-resist block covers the second sub-opening; and
the first sub-opening is not in communication with the second sub-opening.

13. The display panel of claim 12, wherein
along the direction parallel to the plane where the substrate is located, a shortest distance between a point on an edge of the first light-emitting unit and the black matrix is equal.

14. The display panel of claim 12, wherein
a vertical projection of the first sub-opening on the plane where the substrate is located covers a vertical projection of the first light-emitting unit on the plane where the substrate is located, and a shape of the vertical projection of the first sub-opening on the plane where the substrate is located is similar to a shape of the vertical projection of the first light-emitting unit on the plane where the substrate is located.

15. The display panel of claim 12, wherein
the first light-emitting unit emits a first color light, the first color light emitted from the first light-emitting unit comprises a first blocking light, and the first blocking light is light in the first color light emitted from the first light-emitting unit and shielded by the black matrix; and the first blocking light has a second viewing angle range, wherein the second viewing angle range is from $\theta 2$ to $90°$, and $30°\leq\theta 2\leq 60°$.

16. The display panel of claim 13, wherein
each light-emitting unit further comprises a second light-emitting unit, wherein the second light-emitting unit and the first light-emitting unit are configured to emit light in a same color; and
along the direction parallel to the plane where the substrate is located, a shortest distance between a point on an edge of the second light-emitting unit and the black matrix is equal, and a shortest distance between a point on the edge of the second light-emitting unit and the black matrix is equal to the shortest distance between a point on the edge of the first light-emitting unit and the black matrix.

17. The display panel of claim 1, wherein
the first imaging color-resist block is each a color-resist block of a same color.

18. The display panel of claim 1, wherein
a color of the first display color-resist block is same as a color of the first imaging color-resist block, wherein the first color-resist block comprises a green color-resist block.

19. The display panel of claim 1, wherein
the display panel further comprises a black matrix, wherein the black matrix is located on a side of the plurality of color-resist blocks near the plurality of light-emitting units and is disposed between two adjacent color-resist blocks;
the black matrix comprises a first opening, wherein the first opening comprises a first sub-opening and a second sub-opening, the first display color-resist block covers the first sub-opening, and the first imaging color-resist block covers the second sub-opening; and
the display panel further comprises a light shielding layer, wherein the light shielding layer is disposed on a side of the plurality of light-emitting units near the substrate;
wherein the light shielding layer comprises a third opening, and a vertical projection of the second sub-opening on the plane where the substrate is located covers a vertical projection of the third opening on the plane where the substrate is located, wherein the display panel further comprises a pixel defining layer, wherein the pixel defining layer comprises a fourth opening, and a vertical projection of the first light-emitting unit on the plane where the substrate is located coincides with a vertical projection of the fourth opening on the plane where the substrate is located; and a vertical projection of the pixel defining layer on the plane where the substrate is located covers the vertical projection of the third opening on the plane where the substrate is located.

20. A display device, comprising a preset functional element and a display panel,
wherein the display panel comprises:
a substrate;
a plurality of light-emitting units located on a side of the substrate; and
a plurality of color-resist blocks sequentially located on a side of the plurality of light-emitting units facing away from the substrate; wherein
each light-emitting unit comprise a first light-emitting unit, each color-resist block comprises a first color-resist block, and the first color-resist block and the first light-emitting unit are correspondingly disposed;

the first color-resist block comprises a first display color-resist block and a first imaging color-resist block, wherein a vertical projection of the first display color-resist block on a plane where the substrate is located covers a vertical projection of the first light-emitting unit on the plane where the substrate is located;

the first light-emitting unit comprises a first boundary and a second boundary disposed opposite to each other, wherein along a direction parallel to the plane where the substrate is located, the first boundary is located on a side of the second boundary near the first imaging color-resist block;

the first display color-resist block comprises a first edge and a second edge disposed opposite to each other, wherein along the direction parallel to the plane where the substrate is located, the first edge is located on a side of the second edge near the first imaging color-resist block; and along the direction parallel to the plane where the substrate is located, a maximum distance between the first boundary and the first edge is greater than a maximum distance between the second boundary and the second edge.

\* \* \* \* \*